(12) United States Patent
Tsang et al.

(10) Patent No.: US 7,002,492 B2
(45) Date of Patent: Feb. 21, 2006

(54) HIGH RATE RUNNING DIGITAL SUM-RESTRICTED CODE

(75) Inventors: Kinhing P. Tsang, Plymouth, MN (US); Michael J. Link, St. Paul, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 8 days.

(21) Appl. No.: 10/885,987

(22) Filed: Jul. 7, 2004

(65) Prior Publication Data

US 2006/0007024 A1 Jan. 12, 2006

(51) Int. Cl.
*H03M 7/00* (2006.01)

(52) U.S. Cl. .......................... 341/58; 341/59; 360/48; 369/59.25

(58) Field of Classification Search ............... 341/58, 341/59; 360/40, 41, 48; 369/59.25
See application file for complete search history.

(56) References Cited

U.S. PATENT DOCUMENTS

| | | | |
|---|---|---|---|
| 4,486,739 A | 12/1984 | Franaszek et al. | 340/347 |
| 4,520,346 A * | 5/1985 | Shimada | 341/58 |
| 4,675,650 A | 6/1987 | Coppersmith et al. | 340/347 |
| 4,675,652 A | 6/1987 | Machado | 340/347 |
| 4,888,779 A | 12/1989 | Karabed et al. | 371/43 |
| 5,022,051 A | 6/1991 | Crandall et al. | 375/19 |
| 5,095,484 A | 3/1992 | Karabed et al. | 371/30 |
| RE34,088 E | 10/1992 | Johnson et al. | 714/759 |
| 5,243,604 A | 9/1993 | Tsang et al. | 714/765 |
| 5,381,424 A | 1/1995 | Tsang | 714/769 |
| 5,450,443 A | 9/1995 | Siegel et al. | 375/286 |
| 5,537,112 A | 7/1996 | Tsang | 341/59 |
| 5,608,397 A | 3/1997 | Soljanin | 341/58 |
| 5,646,950 A | 7/1997 | Varanasi et al. | 371/43 |
| 5,691,993 A | 11/1997 | Fredrickson | 371/38.1 |
| 5,731,768 A | 3/1998 | Tsang | 341/59 |
| 5,768,293 A | 6/1998 | Van Den Enden et al. | 371/37.1 |
| 5,781,133 A | 7/1998 | Tsang | 341/59 |
| 5,801,649 A | 9/1998 | Fredrickson | 341/58 |
| 5,901,158 A | 5/1999 | Weng et al. | 371/37.12 |
| 5,960,041 A | 9/1999 | Calderbank et al. | 375/292 |
| 6,011,497 A | 1/2000 | Tsang et al. | 341/59 |
| 6,052,072 A | 4/2000 | Tsang et al. | 341/59 |
| 6,111,834 A | 8/2000 | Rub et al. | 360/48 |
| 6,198,582 B1 | 3/2001 | Tsang et al. | 360/40 |

(Continued)

OTHER PUBLICATIONS

K.A.S. Immink and Levente Patrovics, "Performance Assessment of DC-Free Multimode Codes", IEEE Transactions on Communications, Mar. 1997, vol. 45, No. 3, pp. 293-299.

(Continued)

*Primary Examiner*—Howard L. Williams
(74) *Attorney, Agent, or Firm*—Westman, Champlin & Kelly

(57) ABSTRACT

A method and apparatus are provided for encoding successive data words into respective code words. Each data word is mapped into data segments that are constrained to a first number of bit patterns, which is less than a second number of bit patterns that satisfy a first constraint. The data segments are encoded into intermediate code word segments selected from a first set of the bit patterns that satisfy the first constraint, wherein at least some of the bit patterns in the first set violate a second constraint. The intermediate code word segments are encoded into respective code word segments by encoding the intermediate code word segments that violate the second constraint with code word segments selected from a second, different set of the bit patterns that satisfy the first constraint and the second constraint.

23 Claims, 6 Drawing Sheets

U.S. PATENT DOCUMENTS

| | | | |
|---|---|---|---|
| 6,288,655 B1 | 9/2001 | Tsang et al. | 341/59 |
| 6,353,912 B1 | 3/2002 | Uchida | 714/792 |
| 6,362,757 B1 | 3/2002 | Lee et al. | 341/102 |
| 6,377,532 B1 | 4/2002 | Jung et al. | 369/59.23 |
| 6,393,598 B1 | 5/2002 | Tsang et al. | 714/795 |
| 6,467,060 B1 | 10/2002 | Malakapalli et al. | 714/758 |
| 6,480,125 B1 | 11/2002 | Rub et al. | 341/50 |
| 6,535,151 B1 | 3/2003 | Coene | 341/102 |
| 6,559,779 B1 | 5/2003 | Noda et al. | 341/58 |
| 6,567,610 B1 | 5/2003 | Ando et al. | 386/105 |
| 6,696,991 B1 | 2/2004 | Shim et al. | 341/58 |
| 2002/0014980 A1* | 2/2002 | Rub et al. | 341/58 |
| 2004/0066318 A1* | 4/2004 | Tsang | 341/58 |
| 2005/0040976 A1* | 2/2005 | Tsang | 341/59 |

OTHER PUBLICATIONS

Volker Bruan and K.A.S. Immink, "An Enumerative Coding Technique for DC-Free Runlength-Limited Sequences", IEEE Transaction on Communications, Dec. 2000, vol. 48, No. 12, pp. 2024-2031.

K.A.S. Immink, "Spectral Null Codes", IEEE Transaction Con Magnetics, Mar. 1990, vol. 26, No. 2, pp. 1130-1135.

Chang Ki Jeong and Eon Kyeong Joo, "Trellis, Multilevel, and Turbo Codes with DC-Free Characteristic", IEICE Trans. Fundamentals, Dec. 2000, vol. E38-A, No. 12, pp. 2706-2714.

K.A.S. Immink, Paul H. Siegel and Jack K. Wolf, "Codes for Digital Recorders", IEEE Transactions on Information Therory, Oct. 1998, vol. 44, No. 6, pp. 2260-2299.

* cited by examiner

HIGH RATE RUNNING DIGITAL SUM-RESTRICTED CODE

FIELD OF THE INVENTION

The present invention relates to communicating digital signals through a communication channel. In particular, the present invention relates to a method and apparatus for encoding and decoding data in a communication channel.

BACKGROUND OF THE INVENTION

In the field of digital communications, digital information is typically prepared for transmission through a channel by encoding it. The encoded data is then used to modulate a transmission to the channel. A transmission received from the channel is then demodulated and decoded to recover the original information.

Encoding the digital data serves to improve communication performance so that the transmitted signals are less corrupted by noise, fading, or other interference associated with the channel. The term "channel" can include media such as transmission lines, wireless communication and information storage devices such as magnetic, optical or magneto-optical disc drives. In the case of information storage devices, the signal is stored in the channel for a period of time before it is accessed or received. In digital magnetic recording systems, data is recorded in a magnetic layer of the storage media by a transducer. Information is written to the media by switching the direction of write current, which flows through a winding of the transducer. Each transition of the write current will result in a reversal of magnetization in the magnetic layer. In recording systems where magnetic orientation is aligned perpendicularly to the media surface, a binary digit "1" can be represented by the magnetic alignment in one direction, and a binary digit "0" can be represented by an alignment in the opposite direction. When data is to be recovered from the media, a read transducer travels over the media. Each flux reversal induces a voltage change in the read transducer.

Encoding can reduce the probability of noise being introduced into a recovered digital signal when the encoding is adapted to the known characteristics of the data and its interaction with known noise characteristics of the channel. In typical encoding arrangements, data words of m data bits are encoded into larger code words of n code bits, and the ratio m/n is known as the code rate of the encoder. Usually, the code imposes certain constraints on the code words such that the performance of data recovery from the channel is enhanced. For example, the variation of rotational speed of the motor that drives the media in digital recording systems results in non-uniform time intervals between read signal voltage pulses. Instead of using absolute time, the read back signal itself is used to generate the timing signal. A phase lock oscillator (PLO) is used to lock the phase of the timing clock to the phase of the read back voltage. As stated above, a magnetic transition will induce a read back voltage change. To ensure that the PLO is updated frequently, the code limits the run length of strings of either binary digit "0" or "1".

In certain applications, such as in perpendicular recording within digital recording systems, it is desirable for encoded channel sequences to have a spectral null at low frequency. A data sequence of low DC content may avoid DC wandering in the digital receiver and minimize intersymbol interference due to the low frequency cutoff introduced by AC coupled preamplifiers. In other words, sequences with low DC content are desirable. Given a sequence of binary digits, if each binary digit "1" is translated into a plus one (+1) and each binary digit "0" is translated into a minus one (−1), the sequence will be DC-restricted if the running digital sum of the bipolar sequence is bounded. The running digital sum is the sum of all values (+1 and −1) in the bipolar sequence. When the variation of the running digital sum is kept to a small value, the sequence is known to have a tight bound. A tighter bound can improve the performance of the channel.

There is a need for DC-restricted codes that are amenable to practical implementations. It has been found that the mapping of binary input strings into code words having a bounded running digital sum tends to be complex. This complexity can result in considerable engineering effort being consumed to define the encoding and decoding rules and can require complex software or hardware to implement. A DC-restricted code is desired that has limited complexity and a higher code rate.

Various embodiments of the present invention address these problems, and offer other advantages over the prior art.

SUMMARY OF THE INVENTION

One embodiment of the present invention is directed to a method of encoding successive user data words into respective code words. Each data word is mapped into data segments that are constrained to a first number of bit patterns, which is less than a second number of bit patterns that satisfy a first constraint. The data segments are encoded into intermediate code word segments selected from a first set of the bit patterns that satisfy the first constraint. At least some of the bit patterns in the first set violate a second constraint. The intermediate code word segments are encoded into respective code word segments by encoding the intermediate code word segments that violate the second constraint with code word segments selected from a second, different set of the bit patterns that satisfy the first constraint and the second constraint.

Another embodiment of the present invention is directed to an encoder having a user data word input for receiving a user data word and a code word output for producing a respective code word. A mapping block maps the user data word to a plurality of data segments that are constrained to a first number of bit patterns, which is less than a second number of bit patterns that satisfy a first constraint. A first encoder encodes each data segment into an intermediate code word segment selected from a first set of the bit patterns that satisfy the first constraint. At least some of the bit patterns in the first set violate a second constraint. A second encoder encodes the intermediate code word segments into respective code word segments by encoding the intermediate code word segments that violate the second constraint into code word segments selected from a second, different set of the bit patterns that satisfy the first constraint and the second constraint.

Another embodiment of the present invention is directed to a DC-limited code in which successive m-bit unconstrained user data words are encoded into successive, corresponding n-bit code words, wherein m and n are positive integer values. The n-bit code words are constrained such that a running digital sum of segments of the n-bit code words is limited to a range from a positive value to a negative value. The positive and negative values have different absolute values.

Other features and benefits that characterize embodiments of the present invention will be apparent upon reading the following detailed description and review of the associated drawings.

DETAILED DESCRIPTION OF ILLUSTRATIVE EMBODIMENTS

Embodiments of the present invention relate to a DC-restricted code for use in encoding and decoding digital data for transmission through communication channels. The present invention can be used in any communication channel in which DC-restricted codes are useful, such as in information storage systems.

Figure 1:
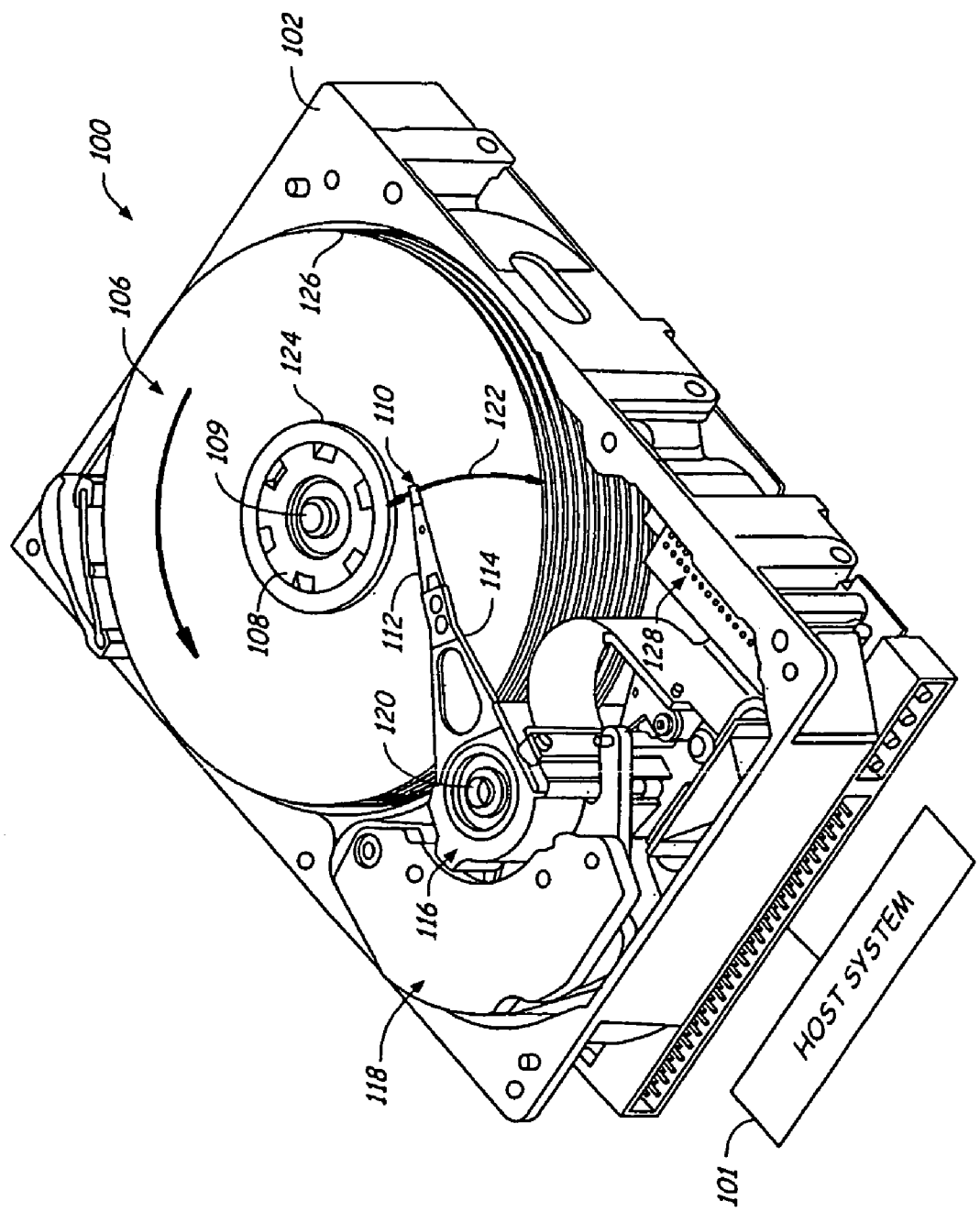
FIG. 1 is a perspective view of one type of information storage system in which an embodiment of the present invention is useful.

FIG. 1 is a perspective view of one type of information storage system in which an embodiment of the present invention is useful. Disc drive 100 forms a part of a communication channel in which disc drive 100 communicates with a host system 101 and includes a housing with a base 102 and a top cover (not shown).

Disc drive 100 further includes a disc pack 106, which is mounted on a spindle motor (not shown), by a disc clamp 108. Disc pack 106 includes a plurality of individual discs, which are mounted for co-rotation about central axis 109. Each disc surface has an associated head, which is mounted to disc drive 100 for communication with the disc surface. In the example shown in FIG. 1, heads 110 are supported by suspensions 112 which are in turn attached to track accessing arms 114 of an actuator 116. The actuator shown in FIG. 1 is of the type known as a rotary moving coil actuator and includes a voice coil motor (VCM), shown generally at 118. Voice coil motor 118 rotates actuator 116 with its attached heads 110 about a pivot shaft 120 to position heads 110 over a desired data track along an arcuate patch 122 between a disc inner diameter 124 and a disc outer diameter 126. Voice coil motor 118 operates under control of internal (or external) circuitry 128.

The heads 110 and rotating disc pack 106 define a communications channel that can receive digital data and reproduce the digital data at a later time. In one embodiment, an encoder within internal circuitry 128 receives unconstrained user data, typically from a digital computer, and then encodes the data into successive code words according to a code. The encoded data is then used to modulate a write current provided to a write transducer in the head 110. The write transducer causes the modulated code words to be encoded on a magnetic layer in disc pack 106. At a later time, a read transducer in the head 110 recovers the successive modulated code words from the magnetic layer as a serial modulated read signal. Read circuitry within internal circuitry 128 demodulates the read signal into successive parallel code words. The demodulated code words are then decoded by a decoder within circuitry 128, which recovers the original user data for use by host system 101. The read and write transducers in head 110 can be configured for longitudinal or perpendicular recording, for example.

According to one embodiment of the present invention, each (n-1)-bit word of the unconstrained user data is encoded into an n-bit code word, according to a DC-restricted code, where n is any positive integer value such as a multiple of 10. For example, if n=70, the code will have a code rate of 69/70. Other code rates can also be used in alternative embodiments of the present invention. In order to generate each 70-bit code word, the corresponding 69-bit user data word is broken down into smaller fragments. The fragments are rearranged and mapped into multiple code word segments, which are then concatenated to form the output code word. In one embodiment, the code selects the code word segments such that the running digital sum (RDS) of each code word segment is $-4, -2, 0, 2, 4$ or $6$ only. However, other RDS ranges can also be used, such as a range in which the RDS value is the absolute value of 6 or less. As the modulated code words are read from the channel, the decoder applies the same coding rules as were used by the encoder, but in reverse order to render the original sequence of user data bits.

The RDS of a binary string can be defined as follows. Given a bit string $\underline{a}=a_1a_2 \ldots a_n$ of length n, a corresponding bipolar string $\underline{A}=A_1A_2 \ldots A_n$ can be obtained by replacing all "0's" in $\underline{a}$ by "-1". The RDS of $\underline{A}$ is the algebraic sum of $A_1A_2 \ldots A_n$. For example, if $\underline{a}=1001001$, then $\underline{A}=1\ -1\ -1\ 1\ -1\ -1\ 1$, and the RDS of $\underline{A}=-1$. If a given binary string $a_1a_2 \ldots a_n$ is to be DC-limited, it is necessary for its RDS to be bounded. A bounded RDS ensures that the bit string $\underline{a}$ has a limited DC content.

The following description is divided into two sections. Section I is a general description of the design of a 69/70-rate DC-restricted code with RDS=4, -2, 0, 2, 4 or 6 at the boundaries between 14-bit segments of the code words. The description includes a process of breaking down the bits of the user data words and mapping the patterns that satisfy the RDS constraints. Section II provides a description of an implementation of an encoder and decoder. Block diagrams are included to illustrate the data flow in a hardware setting. The function of each block is described by logical equations. The block descriptions are similar to a VHDL format with input and output signals listed. However, the logical equations describing the signals are similar to a C language program. Hence, they should be applied in sequence as they are listed.

I. Procedure of Code Construction

In this embodiment, the encoder and decoder limit the RDS of code words such that the performance of data recovery in channels, such as channels with perpendicular magnetic recording media, is enhanced. The RDS-limited code can be used in a system with a Reed Solomon Error Correcting Code (ECC) having 10 bits per symbol, for example. With 10 bits per ECC symbol, the code word size "n" is chosen to be a multiple of 10. To keep the code rate as high as possible, it has been found that a rate 69/70 code can be designed to keep the DC-content of the code words to about 28%.

1. Encoder

Figure 2:
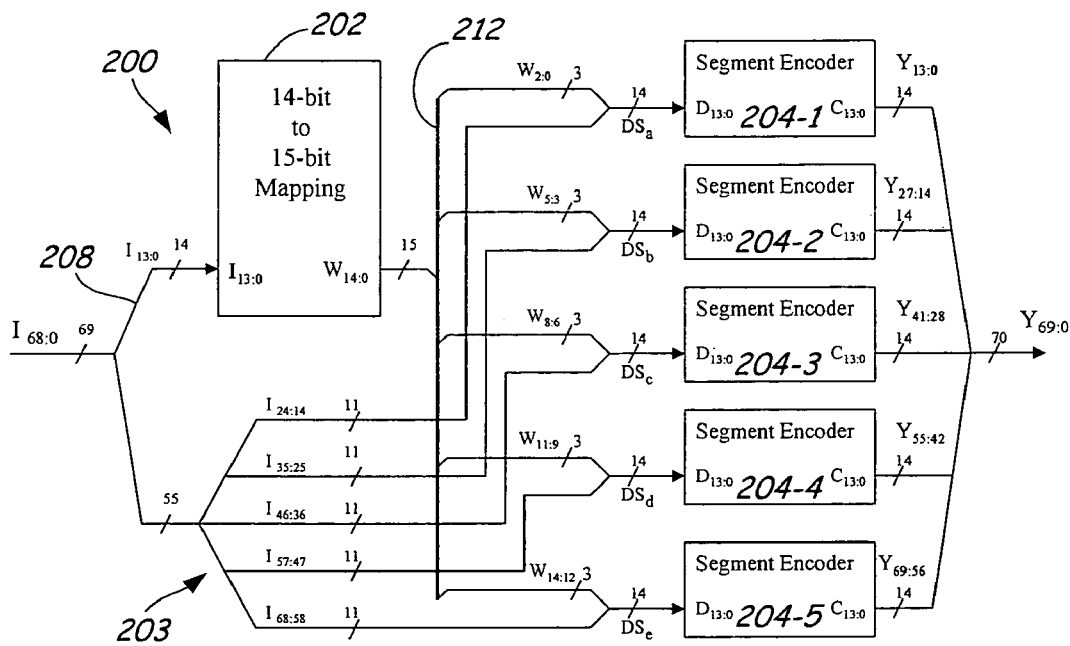
FIG. 2 is a block diagram showing a general layout of an encoder according to one embodiment of the present invention.

FIG. 2 is a block diagram showing a general layout of an encoder 200 having a 69-bit user data input, $I_{68:0}$, a 70-bit code word output. $Y_{69:0}$, a mapping section with a 14-bit to 15-bit mapping block 202, a passthrough section 203, and a plurality of segment encoder blocks 204-1 to 204-5, according to one embodiment of the present invention. In other embodiments, the user data input and the code word output can be any other number of bits, and the arrangement, division and mapping of word segments can be varied from that shown in FIG. 2.

The user data word input $I_{68:0}$ is divided into a 14-bit mapping segment $I_{13:0}$ (labeled 208) and five 11-bit passthrough segments $I_{24:14}$, $I_{35:25}$, $I_{46:36}$, $I_{57:47}$, and $I_{68:58}$ (labeled 210). Mapping segment $I_{13:0}$ is coupled to the input of mapping block 202, and passthrough segments $I_{24:14}$, $I_{35:25}$, $I_{46:36}$, $I_{57:47}$, and $I_{68:58}$ are coupled to the inputs of respective segment encoder blocks 204-1 through 204-5 as the least significant 11 bits of data segments $DS_a$ through $DS_e$, respectively. The number of passthrough segments equals the number of data segments. Bit mapping block 202 encodes each 14-bit mapping segment $I_{13:0}$ into a set of five 3-bit mapped segments $W_{2:0}$, $W_{5:3}$, $W_{8:6}$, $W_{11:9}$, and $W_{14:12}$ (labeled 212) according to pre-defined coding rules, which are described in more detail below. The number of mapped segments equals the number of data segments. The 3-bit mapped segments 212 are combined with respective 11-bit passthrough segments 210 to form 14-bit data segments $DS_a$ through $DS_e$. Data segments $DS_a$ through $DS_e$ are coupled to the data inputs, $D_{13:0}$, of segment encoders 24-1 through 24-5, respectively. Segment encoders 204-1 through 205-1 encode the 14-bit data segments $DS_a$–$DS_e$ into corresponding 14-bit code word segments $Y_{13:0}$, $Y_{27:14}$, $Y_{41:28}$, $Y_{55:42}$, $Y_{69:56}$, respectively, on outputs $C_{13:0}$ of segment encoders 204-1 through 204-5. The 14 bit code word segments are combined to form the 70-bit code word output $Y_{69:0}$.

As described in more detail below, bit mapping block 202 constrains the bit patterns formed by the 3-bit mapped segments 212 such that the number of possible bit patterns formed by data segments $DS_a$ through $DS_e$ is less than the number of bit patterns that satisfy a first constraint, such as an RDS constraint, which is enforced by segment encoders 204. Each data segment $DS_a$–$DS_e$ has 14 bits. If the bit patterns were unconstrained by bit mapping block 202, each data segment could form one of a possible 16,384 bit patterns. However, only a subset of those bit patterns satisfy the desired RDS constraint. Bit mapping block 202 encodes mapped segments 212 such that the data segments $DS_a$–$DS_e$ have a number of possible bit patterns that is less than the number of bit patterns that satisfy the RDS constraint. Segment encoders 204-1 through 204-5 can then encode the data segments so as to satisfy the desired RDS constraint without adding any additional bits to the code words. Any unused bit patterns (that also satisfy the RDS constraint) can then be used by segment encoders 204 to further encode the data segments so as to satisfy a second constraint, such as a "k" constraint. A "k" constraint limits the distance between transitions in the bit patterns within the code word segments to no greater than a maximum number "k". However, any other type of "second" constraint can also be used in alternative embodiments of the present invention.

Figure 3:
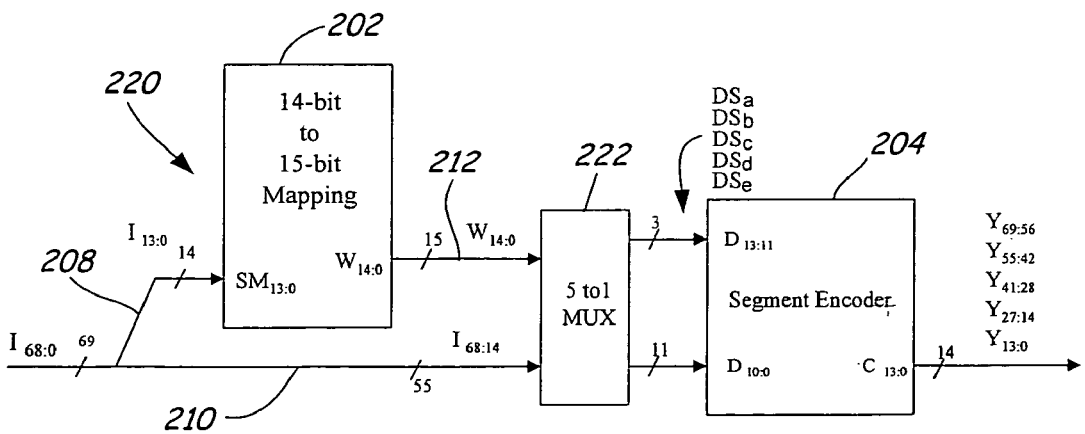
FIG. 3 is a block diagram showing a general layout of an encoder according to an alternative embodiment of the present invention.

FIG. 3 is a block diagram illustrating an encoder 220 according to an alternative embodiment of the present invention. The same reference numerals are used in FIG. 3 as were used in FIG. 2 for the same or similar elements. Since each of the segment encoders 204 shown in FIG. 2 are identical, the amount of hardware required for encoder 220 can be reduced by using a single segment encoder 204 with a suitable multiplexer 222 as shown in FIG. 3. Each of the five data segments $DS_a$–$DS_e$ is encoded by segment encoder 204 in one of five different clock cycles. Table 1 shows the outputs of multiplexer 222 and the output of encoder 204 in each of the five clock cycles.

TABLE 1

| Clock | Signal assignment by clock cycle | | | | |
|---|---|---|---|---|---|
| Cycle | 1 | 2 | 3 | 4 | 5 |
| $SM_{13:0}$ in | | | $I_{13:0}$ | | |
| $D_{10:0}$ in | $I_{24:14}$ | $I_{35:25}$ | $I_{46:36}$ | $I_{57:47}$ | $I_{68:58}$ |
| $D_{13:11}$ in | $W_{2:0}$ | $W_{5:3}$ | $W_{8:6}$ | $W_{11:9}$ | $W_{14:12}$ |
| $C_{13:0}$ | $Y_{13:0}$ | $Y_{27:14}$ | $Y_{41:28}$ | $Y_{55:42}$ | $Y_{69:56}$ |

1.1 14-bit to 15-bit Mapping Block 202

In one embodiment, the 14-bit to 15-bit mapping block 202 maps a 14-bit mapping segment $I_{13:0}$ of the user data word data into five groups of 3-bit patterns of mapped segments $W_{2:0}$, $W_{5:3}$, $W_{8:6}$, $W_{11:9}$, and $W_{14:12}$, such that none of the 3-bit groups will be "111". Any other bit pattern or patterns can be eliminated in alternative embodiments of the present invention. The purpose of mapping block 202 is to limit the number of bit patterns in mapped segments 212 and thus in data segments $DS_a$–$DS_e$ such that these segments can be easily encoded in encoders 204 to satisfy desired constraints.

Assume the 14 bits of data on mapping segment $I_{13:0}$ is (I13, I12, I11, I10, I9, I8, I7, I6, I5, I4, I3, I2, I1, I0) and the five groups of mapped segments on $W_{14:0}$ is (W14,W13,W12) (W11,W10,W9) (W8,W7,W6) (W5,W4,W3) and (W2,W1,W0). If none of the following four groups (I11,I10,I9) (I8,I7,I6) (I5,I4,I3) (I2,I1,I0) contains "111", mapping block 202 maps the input data bits $I_{13:10}$ directly to the mapped bits W13:W0. Bit W14 is mapped to "0". Bit W14 flags the decoder as to which type of mapping is used, direct or encoded. This mapping is shown in Table 2 below:

TABLE 2

| W14 | W13 | W12 | W11 | W10 | W9 | W8 | W7 | W6 | W5 | W4 | W3 | W2 | W1 | W0 |
|---|---|---|---|---|---|---|---|---|---|---|---|---|---|---|
| 0 | I13 | I12 | I11 | I10 | I9 | I8 | I7 | I6 | I5 | I4 | I3 | I2 | I1 | I0 |

If one of the groups (I11,I10,I9) (I8,I7,I6) (I5,I4,I3) (I2,I1,I0) contains "111", W14 is mapped to "1". The remaining bits W13:W0 are encoded through the following logic:

Define
   G0 is true if (I2,I1,I0)=(1,1,1)
   G1 is true if (I5,I4,I3)=(1,1,1)
   G2 is true if (I8,I7,I6)=(1,1,1)
   G3 is true if (I11,I10,I9)=(1,1,1)
   G4 is true if (I13,I12)=(1,1)
   When one of the four groups contains "111", we have one of the following four cases:
   H0=!G3&!G2&!G1&G0 (only G0 is true)
   H1=!G3&!G2&G1&!G0 (only G1 is true)
   H2=!G3&G2&!G1&!G0 (only G2 is true)
   H3=G3&!G2&!G1&!G0 (only G3 is true)

where "&" represents a bitwise logic AND, and "!" represents a logic inversion.

When two of the four groups contain "111", we have one of the following six cases:
H01=!G3&!G2&G1&G0
H02=!G3&G2&!G1&G0
H03=G3&!G2&!G1&G0
H12=!G3&G2&G1&!G0
H13=G3&!G2&G1&!G0
H23=G3&G2&!G1&!G0

When three of the four groups contain "111", we have one of the following four cases:
H012=!G3&G2&G1&G0
H013=G3&!G2&G1&G0
H023=G3&G2&!G1&G0
H123=G3&G2&G1&!G0

Finally, if all four groups contain "111", we define:
H0123=G3&G2&G1&G0

If G4 is not true, i.e., (I13, I12)≠(1,1), we may encode the above mentioned cases as follows:

1.2 Segment Encoder 204

As described above, each 3-bit mapped segment 212 is combined with an unconstrained 11-bit passthrough segment 210 to form one of the five 14-bit data segments $DS_a$–$DS_e$. The function of each segment encoder 204 shown in FIGS. 2 and 3 is to encode a 14-bit data segment $DS_a$–$DS_e$ into a 14-bit code word that satisfies the desired RDS and "k" constraints.

Each 3-bit mapping segment 212 is mapped to avoid the bit pattern "1il" and therefore can have one of 7 values. Each unconstrained passthrough segment 210 has 11 bits. Since $2^{11}=2048$ and the 3-bit pattern represents 7 values, the 14-bit data segments represent a total of 7*2048=14,336 patterns. To simplify the encoder mapping, we choose to exclude the pattern "000" instead of the pattern "111". Therefore, the five 3-bit mapped segments 212 are inverted before entering the segment encoders 204. In order to keep the RDS value

TABLE 3

|       | W14 | W13 | W12 | W11 | W10 | W9 | W8 | W7  | W6  | W5 | W4  | W3  | W2 | W1 | W0 |
|-------|-----|-----|-----|-----|-----|----|----|-----|-----|----|-----|-----|----|----|----|
| H0    | 1   | I13 | I12 | 0   | 0   | 0  | I11| I10 | I9  | I8 | I7  | I6  | I5 | I4 | I3 |
| H1    | 1   | I13 | I12 | 0   | 0   | 1  | I11| I10 | I9  | I8 | I7  | I6  | I2 | I1 | I0 |
| H2    | 1   | I13 | I12 | 0   | 1   | 0  | I11| I10 | I9  | I5 | I4  | I3  | I2 | I1 | I0 |
| H3    | 1   | I13 | I12 | 0   | 1   | 1  | I8 | I7  | I6  | I5 | I4  | I3  | I2 | I1 | I0 |
| H01   | 1   | I13 | I12 | 1   | 0   | 0  | 0  | 0   | 0   | I11| I10 | I9  | I8 | I7 | I6 |
| H02   | 1   | I13 | I12 | 1   | 0   | 0  | 0  | 0   | 1   | I11| I10 | I9  | I5 | I4 | I3 |
| H03   | 1   | I13 | I12 | 1   | 0   | 0  | 0  | 1   | 0   | I8 | I7  | I6  | I5 | I4 | I3 |
| H12   | 1   | I13 | I12 | 1   | 0   | 0  | 0  | 1   | 1   | I11| I10 | I9  | I2 | I1 | I0 |
| H13   | 1   | I13 | I12 | 1   | 0   | 0  | 1  | 0   | 0   | I8 | I7  | I6  | I2 | I1 | I0 |
| H23   | 1   | I13 | I12 | 1   | 0   | 0  | 1  | 0   | 1   | I5 | I4  | I3  | I2 | I1 | I0 |
| H012  | 1   | I13 | I12 | 1   | 0   | 0  | 1  | 1   | 0   | 0  | 1   | 1   | I11| I10| I9 |
| H013  | 1   | I13 | I12 | 1   | 0   | 0  | 1  | 1   | 0   | 0  | 1   | 0   | I8 | I7 | I6 |
| H023  | 1   | I13 | I12 | 1   | 0   | 0  | 1  | 1   | 0   | 0  | 0   | 1   | I5 | I4 | I3 |
| H123  | 1   | I13 | I12 | 1   | 0   | 0  | 1  | 1   | 0   | 0  | 0   | 0   | I2 | I1 | I0 |
| H0123 | 1   | I13 | I12 | 1   | 0   | 0  | 1  | 1   | 0   | 1  | 0   | 0   | 0  | 0  | 0  |

If G4 is true, the mapping will be as follows:

TABLE 4

|       | W14 | W13 | W12 | W11 | W10 | W9 | W8 | W7  | W6  | W5 | W4  | W3  | W2 | W1 | W0 |
|-------|-----|-----|-----|-----|-----|----|----|-----|-----|----|-----|-----|----|----|----|
| H0    | 1   | 0   | 0   | 1   | 0   | 1  | I11| I10 | I9  | I8 | I7  | I6  | I5 | I4 | I3 |
| H1    | 1   | 0   | 0   | 1   | 1   | 0  | I11| I10 | I9  | I8 | I7  | I6  | I2 | I1 | I0 |
| H2    | 1   | 0   | 1   | 1   | 0   | 1  | I11| I10 | I9  | I5 | I4  | I3  | I2 | I1 | I0 |
| H3    | 1   | 0   | 1   | 1   | 1   | 0  | I8 | I7  | I6  | I5 | I4  | I3  | I2 | I1 | I0 |
| H01   | 1   | 1   | 0   | 1   | 0   | 1  | 0  | 0   | 0   | I11| I10 | I9  | I8 | I7 | I6 |
| H02   | 1   | 1   | 0   | 1   | 0   | 1  | 0  | 0   | 1   | I11| I10 | I9  | I5 | I4 | I3 |
| H03   | 1   | 1   | 0   | 1   | 0   | 1  | 0  | 1   | 0   | I8 | I7  | I6  | I5 | I4 | I3 |
| H12   | 1   | 1   | 0   | 1   | 0   | 1  | 0  | 1   | 1   | I11| I10 | I9  | I2 | I1 | I0 |
| H13   | 1   | 1   | 0   | 1   | 0   | 1  | 1  | 0   | 0   | I8 | I7  | I6  | I2 | I1 | I0 |
| H23   | 1   | 1   | 0   | 1   | 0   | 1  | 1  | 0   | 1   | I5 | I4  | I3  | I2 | I1 | I0 |
| H012  | 1   | 1   | 0   | 1   | 0   | 1  | 1  | 1   | 0   | 0  | 1   | 1   | I11| I10| I9 |
| H013  | 1   | 1   | 0   | 1   | 0   | 1  | 1  | 1   | 0   | 0  | 1   | 0   | I8 | I7 | I6 |
| H023  | 1   | 1   | 0   | 1   | 0   | 1  | 1  | 1   | 0   | 0  | 0   | 1   | I5 | I4 | I3 |
| H123  | 1   | 1   | 0   | 1   | 0   | 1  | 1  | 1   | 0   | 0  | 0   | 0   | I2 | I1 | I0 |
| H0123 | 1   | 1   | 0   | 1   | 0   | 1  | 1  | 1   | 0   | 1  | 0   | 0   | 0  | 0  | 0  |

In Tables 3 and 4, the particular manner in which the bits are encoded can be altered in alternative embodiments of the present invention. The manner shown in Tables 3 and 4 are used to simplify the decoding process as the mapped 3-bit groups can be used to identify which case has occurred. For example, if the bits in group (W11, W10, W9) are "000", Table 3 was used and the case H0 has occurred. The original bits $I_{13:0}$ can then be recovered by identifying the pattern formed by W11:W9.

of each code word segment $C_{13:0}$ close to zero, segment encoders 204 map the 14-bit data segments into 14-bit code word segments having RDS values equal to −4, −2, 0, 2, 4 or 6 only. There are a total of 14,443 14-bit patterns that satisfy this RDS constraint. Since 14,336<14,443, it is possible to use only a subset of the 14-bit patterns that have the desired RDS values as the 14-bit code words. The remaining unused 14-bit patterns that satisfy the RDS constraint can be used to further encode the code words so as to satisfy a further constraint, such as the "k" constraint.

To avoid the cumulative RDS values being increased too fast, segment encoders 204 keep track of the RDS=6 patterns and reverse their polarity alternately. That means every other code word having RDS=6 is inverted. These inverted code words can be recovered because words with RDS=−6 are not valid code words so their identities can be restored by simple inversion.

In this example, every 69 (14+5*11) input bits are used to generate five 14-bit code words. These five 14-bit codeword segments from segment encoders 204 form a 70-bit code word. These bits are already in NRZ format and can be sent directly to the write head in embodiments in which the communication channel includes a data storage device. These bits can also be sent to an encoder of a Reed Solomon Error Correcting Code Encoder (not shown) in order to generate redundancy that can be used to correct errors during read back.

2. Decoder

Figure 4:
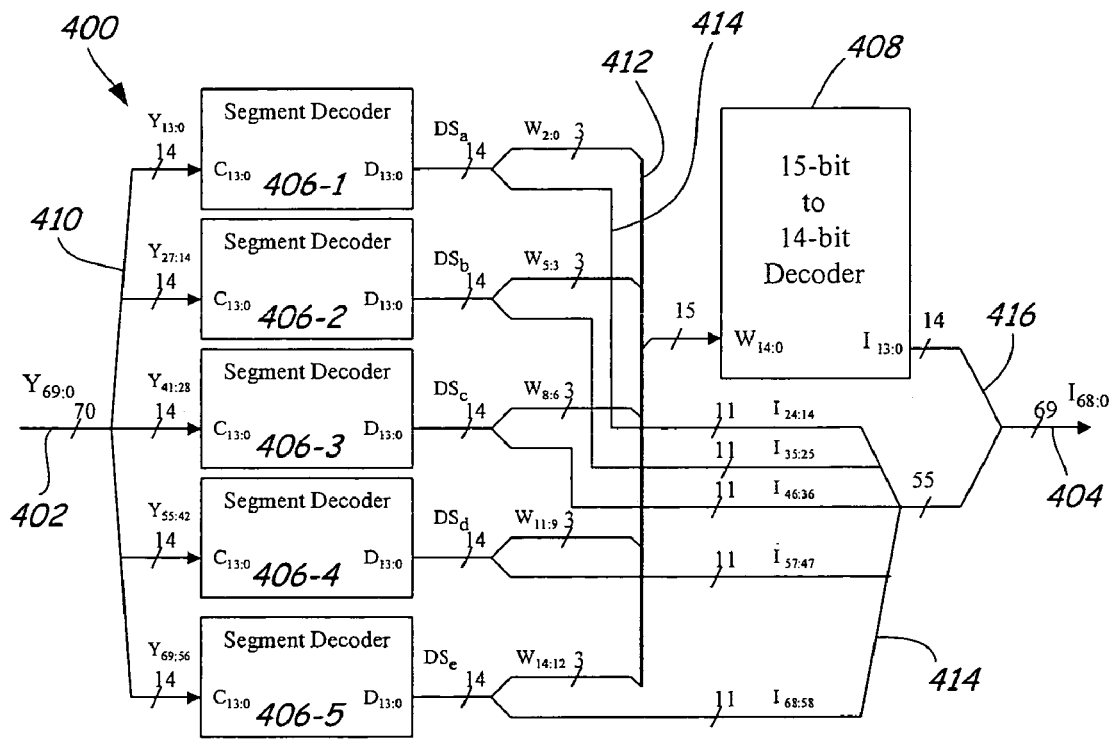
FIG. 4 is a block diagram showing a general layout of a decoder according to one embodiment of the present invention.

FIG. 4 is a block diagram of a decoder 400 according to one embodiment of the present invention. Decoder 400 includes code word input 402, user data word output 404, segment decoders 406-1 through 406-5, and 15-bit to-14-bit decoder 408. Decoder 400 applies the reverse of the coding rules applied by encoder 200 to recover the user data words from each successive code word received on input 402. Each received codeword $Y_{69:0}$ on input 402 is divided into a number (such as five) code word segments 410. With five segments 410, each code word segment has 14 bits. Each 14-bit code word segment 410 is decoded by a segment decoder 406 into a respective 14-bit data segment $DS_a$–$DS_e$. Each 14-bit data segment is then mapped into a 3-bit mapped segment 412 ($W_{2:0}$, $W_{5:3}$, $W_{8:6}$, $W_{11:9}$, $W_{14:12}$) and an 11-bit passthrough segment 414. The five 3-bit mapped segments 412 are further decoded by the 15-bit to 14-bit decoder 408. This decoded 14-bit pattern ($I_{13:0}$) is concatenated with the five 11-bit passthrough segments 414 to form the original 69-bit user data word $I_{68:0}$ on output 404.

Figure 5:
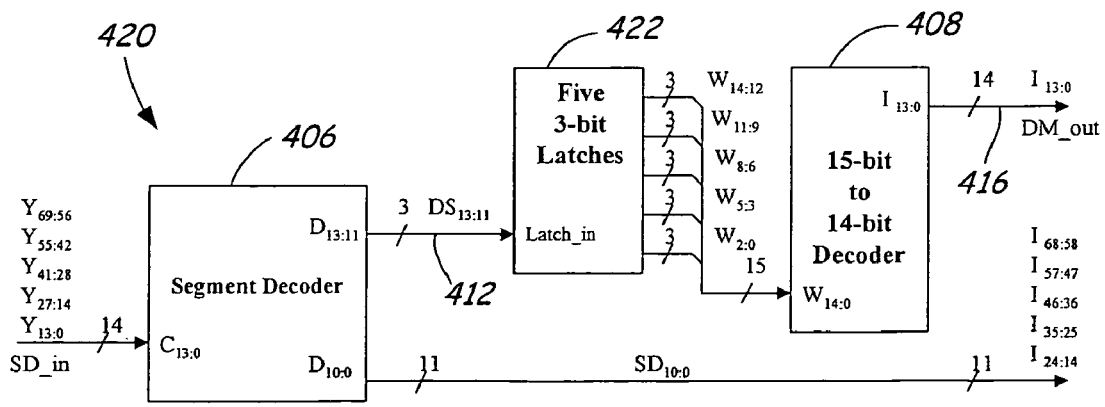
FIG. 5 is a block diagram showing a general layout of a decoder according to an alternative embodiment of the present invention.

Just as in the encoder, decoding of the five code word segments can be done in five cycles with a single segment decoder 406 and five 3-bit latches 422, as shown in FIG. 5, in an alternative embodiment of the present invention. The following table shows the input and output bits during each clock cycle.

TABLE 5

| Clock Cycle | Signal assignment by clock cycle | | | | |
|---|---|---|---|---|---|
| | 1 | 2 | 3 | 4 | 5 |
| SD_in | $Y_{13:0}$ | $Y_{27:14}$ | $Y_{41:28}$ | $Y_{55:42}$ | $Y_{69:56}$ |
| Latch_in | $W_{2:0}$ | $W_{5:3}$ | $W_{8:6}$ | $W_{11:9}$ | $W_{14:12}$ |
| $SD_{10:0}$ out | $I_{24:14}$ | $I_{35:25}$ | $I_{46:36}$ | $I_{57:47}$ | $I_{68:58}$ |
| Dm_out | | | | | $I_{13:0}$ |

II. Descriptions of Encoder and Decoder

The following section provides an implementation of encoder 200 and decoder 400 according to one embodiment of the present invention. The details of the circuits and operations described below are examples only and can be performed in hardware, software, firmware and/or combinations thereof. Block diagrams are shown to illustrate the data flow in an example of a hardware setting. The function of each block is described by logical equations. The block descriptions are similar to a VHDL format with input and output signals listed. However, the logical equations describing the signals are similar to a C language program. Hence, they should be applied in sequence as they are listed.

Table 6 provides definitions for the symbols and logic operations used below to describe the functions of each block.

TABLE 6

| Symbol definition: | |
|---|---|
| "|" | Bitwise OR |
| "&" | Bitwise AND |
| "^" | Bitwise XOR |
| "!x" | Inverse of bit x |
| "!C(n:0)" | Inverse of all bits of word C |

1. Encoder

The following subsections 1.1 and 1.2 provide implementations of 14-bit to 15-bit mapping block 202 and segment encoders 204 shown in FIGS. 2 and 3.

1.1 14-bit to 15-bit Mapping Block 202

The 14-bit to 15-bit mapping block 202 has the following inputs and outputs:

Input:
I13,I12,I11,I10,I9,I8,I7,I6,I5,I4,I3,I2,I1,I0
(14-bit Data word segment)

Output:
W14,W13,W12,W11,W10,W9,W8,W7,W6,W5,W4,W3,W2,W1,W0
(15-bit Mapped segment)

The following logical equations describe the function performed by mapping block 202 according to one embodiment of the present invention:

G4=I13&I12
G3=I11&I10&I9
G2=I8&I7&I6
G1=I5&I4&I3
G0=I2&I1&I0
HH=!G3&!G2&!G1&!G0
H0=!G3&!G2&!G1&G0
H1=!G3&!G2&G1&!G0
H2=!G3&G2&!G1&!G0
H3=G3&!G2&!G1&!G0
H01=!G3&!G2&G1&G0
H02=!G3&G2&!G1&G0
H03=G3&!G2&!G1&G0
H12=!G3&G2&G1&!G0
H13=G3&!G2&G1&!G0
H23=G3&G2&!G1&!G0
H012=!G3&G2&G1&G0
H013=G3&!G2&G1&G0
H023=G3&G2&!G1&G0
H123=G3&G2&G1&!G0
H0123=G3&G2&G1&G0
JK=!HH
JJ=(JK&!G4)
KK=(JK&G4)
T2=(!H0&!H1&!H2&!H3)
T3=H012|H013|H023|H123|H0123
J6d9=(H0|H1|H2)
J3d9=(H0|H02|H12)
J3d6=(H0|H1|H03|H13)
J3d3=(H2|H3|H23)
J0d6=(H01|H013)
J0d3=(H0|H02|H03|H023)
J0d0=(H1|H2|H3|H12|H13|H23|H123)
J11=T2
J10=(H2|H3)
J9=(H1|H3)

J8=(I11&J6d9)|(I8&H3)|H13|H23|T3
J7=(I10&J6d9)|(I7&H3)|H03|H12|T3
J6=(I9&J6d9)|(I6&H3)|H02|H12|H23
J5=(I11&J3d9)|(I8&J3d6)|(I5&J3d3)|H0123
J4=(I10&J3d9)|(I7&J3d6)|(I4&J3d3)|H012|H013
J3=(I9&J3d9)|(I6&J3d6)|(I3&J3d3)|H012|H023
J2=(I11&H012)|(I8&J0d6)|(I5&J0d3)|(I2&J0d0)
J1=(I10&H012)|(I7&J0d6)|(I4&J0d3)|(I1&J0d0)
J0=(I9&H012)|(I6&J0d6)|(I3&J0d3)|(I0&J0d0)
W14=JK
W13=(I13&(HH|JJ))|(KK&T2)
W12=(I12&(HH|JJ))|(KK&(H2|H3))
W11=(I11&HH)|(J11&JJ)|(KK)
W10=(I10&HH)|(J10&JJ)|(KK&(H1|H3))
W9=(I9&HH)|(J9&JJ)|(KK&(H0|H2|T2))
W8=(I8&HH)|(J8&JK)
W7=(I7&HH)|(J7&JK)
W6=(I6&HH)|(J6&JK)
W5=(I5&HH)|(J5&JK)
W4=(I4&HH)|(J4&JK)
W3=(I3&HH)|(J3&JK)
W2=(I2&HH)|(J2&JK)
W1=(I1&HH)|(J1&JK)
W0=(I0&HH)|(J0&JK)

1.2 Segment Encoder 204

Segment encoder 204 has the following inputs and outputs:

Input:
D13,D12,D11,D10,D9,D8,D7,D6,D5,D4,D3,D2,D1,D0
(14-bit Data Segment)

Output:
C13,C12,C11,C10,C9,C8,C7,C6,C5,C4,C3,C2,C1,C0
(14-bit Code Word Segment).

As mentioned above, for simplicity of encoding, the 3-bit mapped segments received from mapping block 202 are inverted prior to being applied to the inputs of segment encoders 204 while the passthrough segments of the input data word are left unchanged as shown below:

DSa $_{13:11}$=!W$_{2:0}$ DSa $_{10:0}$=I$_{24:14}$
DSb $_{13:11}$=!W$_{5:3}$ DSb $_{10:0}$=I$_{35:25}$
DSc $_{13:11}$=!W$_{8:6}$ DSc $_{10:0}$=I$_{46:36}$
DSd $_{13:11}$=!W$_{11:9}$ DSd $_{10:0}$=I$_{57:47}$
DSe $_{13:11}$=!W$_{14:12}$ DSe $_{10:0}$=I$_{68:58}$

Figure 6:
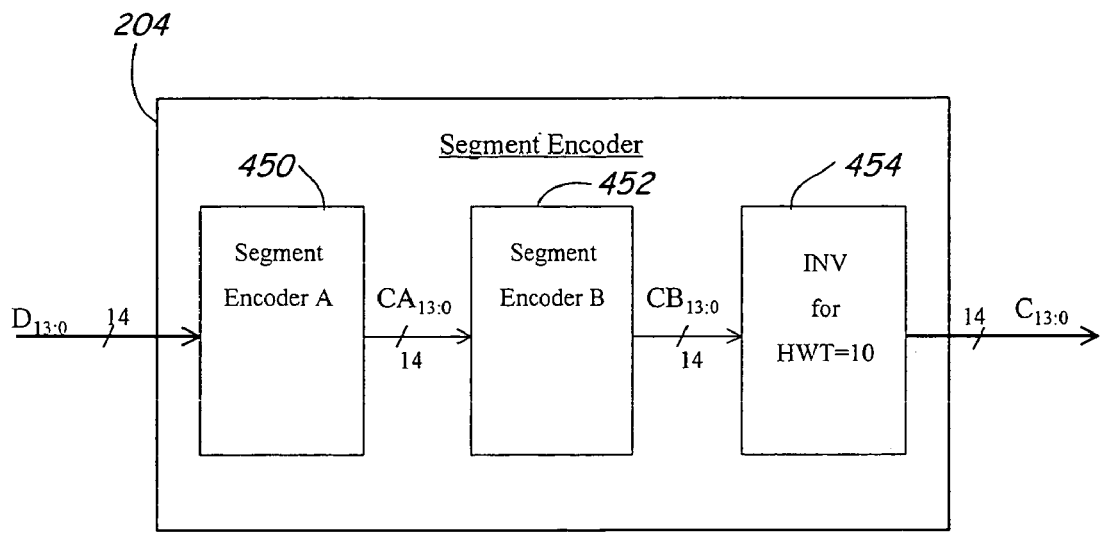
FIG. 6 is a block diagram of a segment encoder employed within the encoders shown in FIGS. 2 and 3, according to one embodiment of the present invention.

FIG. 6 is a block diagram of one of the segment encoders 204, according to one embodiment of the present invention. Segment encoder 204 includes segment encoder "A" (labeled 450), segment encoder "B" (labeled 452) and inverter block 454. The respective 14-bit data segment is applied to the data input $D_{13:0}$ of segment encoder "A", which encodes the data segment into an intermediate code word segment $CA_{13:0}$, which satisfies the desired RDS constraint. In this example, the bit patterns of the intermediate code word segments $CA_{13:0}$ are constrained so as to have an RDS of −4, −2, 0, 2, 4 or 6 only. As described in more detail below with respect to FIG. 7, many of the 14, 336 possible input patterns on $D_{13:0}$ already satisfy the RDS constraint. These patterns are passed straight through segment encoder "A" without change. If the incoming bit pattern on $D_{13:0}$ does not satisfy this constraint, the bit pattern is encoded using a subset of the RDS-valid patterns.

Segment encoder "B" receives the successive intermediate code word segments $CA_{13:0}$ and encodes those segments into code word segments $CB_{13:0}$, which satisfy a second constraint. In one example, the code word segments $CB_{13:0}$ are encoded so as to satisfy the "k" constraint, which limits the distance between transitions in the bit patterns to a selected value, such as 14.

Inverter block 454 performs a selective inversion for those code word segments $CD_{13:0}$ that have an RDS of +6. Every other code word segment $CD_{13:0}$ having RDS=+6 is inverted such that these code word segments do not cause the total RDS to increase too fast. As described in more detail with respect to FIG. 6, inverter block 454 checks the pattern of $CD_{13:0}$ to see whether it has a hamming weight of ten (equivalent to RDS=+6) and if so, selectively inverts $CD_{13:0}$ based on the polarity of the previous code word segment having an RDS of six. Inverter block 454 keeps track of the polarity of the previous segment having an RDS of six through a status flag. This flag is toggled with each successive segment having an RDS of six. The resulting code word segments $C_{13:0}$ are output for concatenating to the other code word segments to form the overall code word output.

1.2.1 Segment Encoder "A" 450

Segment encoder "A" has the following inputs and outputs:

Input:
D13,D12,D11,D10,D9,D8,D7,D6,D5,D4,D3,D2,D1,D0
(14-bit Data Segment)

Output:
C13,C12,C11,C10,C9,C8,C7,C6,C5,C4,C3,C2,C1,C0
(14-bit Code Word Segment)

Figure 7:
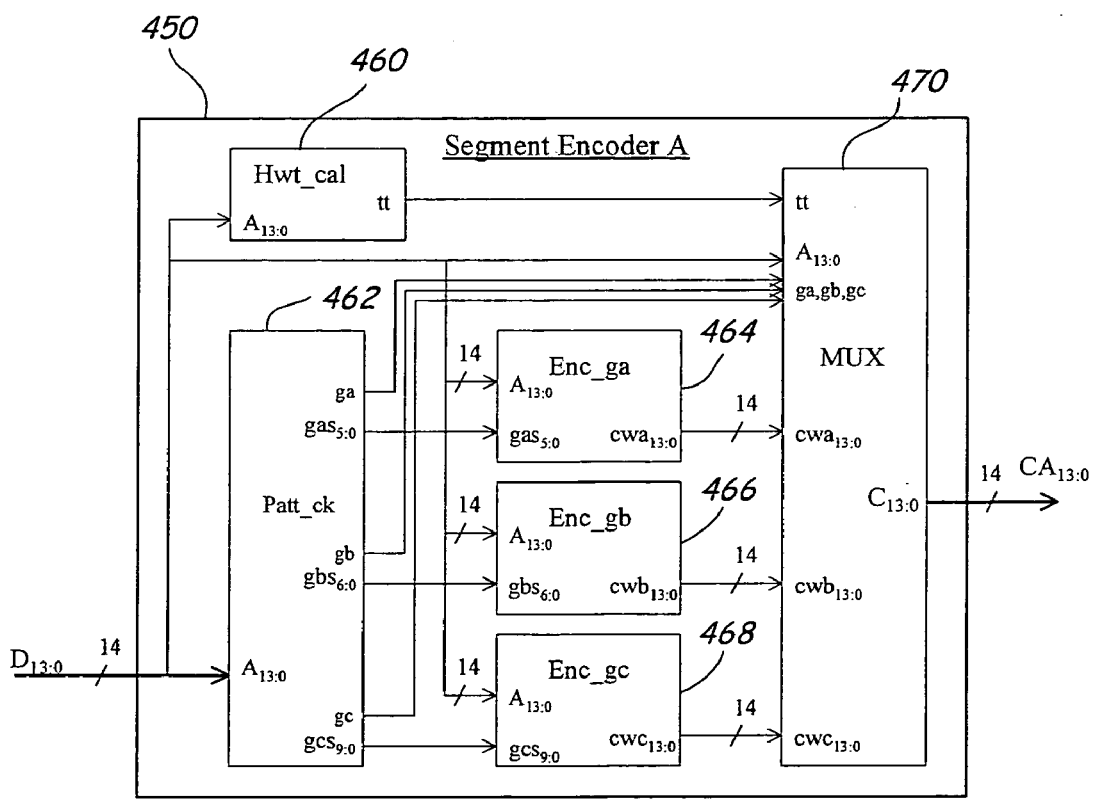
FIG. 7 is a block diagram, which illustrates a segment encoder "A" within the segment encoder shown in FIG. 6.

FIG. 7 is a block diagram, which illustrates segment encoder "A" in greater detail. Segment encoder "A" (450) includes a hamming weight calculator 460, a pattern check circuit 462, a group "a" encoder 464, a group "b" encoder 466, a group "c" encoder 468 and a multiplexer 470.

1.2.1.1 Hamming Weight Calculator 460

Hamming weight calculator 460 calculates the RDS of the incoming data segment $D_{13:0}$. If the RDS is −4, −2, 0, 2, 4, or 6, the data segment already satisfies the RDS constraint and hamming weight calculator 460 sets flag output "tt" to a true value. If flag "tt" is true, multiplexer 470 routes the data segment $D_{13:0}$ (through multiplexer input $A_{13:0}$) directly to multiplexer output $C_{13:0}$.

The following logical equations describe the function of hamming weight calculator 460:

Input:
A13,A12,A11,A10,A9,A8,A7,A6,A5,A4,A3,A2,A1,A0
(14-bit Data Segment)

Output: tt
hwt = A13 + A12+A11+A10+A9+A8+A7+A6+A5+A4+ A3+A2+A1+A0
If ((hwt>=5)&&(hwt<=10)) tt=1
else tt=0

1.2.1.2 Pattern Check Circuit 462

Pattern check circuit 462 receives the data segment $D_{13:0}$ on input $A_{13:0}$ and determines which of three groups, group "a", group "b" or group "c" the pattern belongs. Also, group "a" has 6 subgroups, group "b" has 7 subgroups and group "c" has 10 subgroups. Based on the input pattern of $A_{13:0}$, pattern check circuit 462 generates a corresponding group select signal ga, gb, or gc that identifies the corresponding group and generates a corresponding subgroup select word $gas_{5:0}$, $gbs_{6:0}$, or $gcs_{9:0}$ that identifies the corresponding subgroup.

The group select signals ga, gb and gc are provided to multiplexer 470 as multiplexer select signals, which are used to select the output of the appropriate group encoder, group "a", group "b" or group "c".

The following logical equations describe the function of pattern check circuit 462:

Input:
A13,A12,A11,A10,A9,A8,A7,A6,A5,A4,A3,A2,A1,A0
(14-bit Data Segment)

Output:
$gas_{5:0}$, $gbs_{6:0}$, $gcs_{9:0}$, ga, gb, gc

| | |
|---|---|
| wa3= A13&A12 | wa2= A13&!A12 |
| wa1=!A13&A12 | wa0=!A13&!A12 |
| wbF= A11& A10& A9& A8 | wbE= A11& A10& A9&!A8 |
| wbD= A11& A10&!A9& A8 | wbC= A11& A10&!A9&!A8 |
| wbB= A11&!A10& A9& A8 | wbA= A11&!A10& A9&!A8 |
| wb9= A11&!A10&!A9& A8 | wb8= A11&!A10&!A9&!A8 |
| wb7=!A11& A10& A9& A8 | wb6=!A11& A10& A9&!A8 |
| wb5=!A11& A10&!A9& A8 | wb4=!A11& A10&!A9&!A8 |
| wb3=!A11&!A10& A9& A8 | wb2=!A11&!A10& A9&!A8 |
| wb1=!A11&!A10&!A9& A8 | wb0=!A11&!A10&!A9&!A8 |
| wcF= A7& A6& A5& A4 | wcE= A7& A6& A5&!A4 |
| wcD= A7& A6&!A5& A4 | wcC= A7& A6&!A5&!A4 |
| wcB= A7&!A6& A5& A4 | wcA= A7&!A6& A5&!A4 |
| wc9= A7&!A6&!A5& A4 | wc8= A7&!A6&!A5&!A4 |
| wc7=!A7& A6& A5& A4 | wc6=!A7& A6& A5&!A4 |
| wc5=!A7& A6&!A5& A4 | wc4=!A7& A6&!A5&!A4 |
| wc3=!A7&!A6&!A5& A4 | wc2=!A7&!A6& A5&!A4 |
| wc1=!A7&!A6&!A5& A4 | wc0=!A7&!A6&!A5&!A4 |
| wdF= A3& A2& A1& A0 | wdE= A3& A2& A1&!A0 |
| wdD= A3& A2&!A1& A0 | wdC= A3& A2&!A1&!A0 |
| wdB= A3&!A2& A1& A0 | wdA= A3&!A2& A1&!A0 |
| wd9= A3&!A2&!A1& A0 | wd8= A3&!A2&!A1&!A0 |
| wd7=!A3& A2& A1& A0 | wd6=!A3& A2& A1&!A0 |
| wd5=!A3& A2&!A1& A0 | wd4=!A3& A2&!A1&!A0 |
| wd3=!A3&!A2& A1& A0 | wd2=!A3&!A2& A1&!A0 |
| wd1=!A3&!A2&!A1& A0 | wd0=!A3&!A2&!A1&!A0 | pa12=wa1|wa2
pb18=wb1|wb2|wb4|wb8
pb7e=wb7|wbB|wbD|wbE
pb7f=pb7e|wbF
pb9c=wb9|wbA|wbC
pb3c=wb3|wb5|wb6|pb9c
pc08=wc0|wc1|wc2|wc4|wc8
pc7f=wc7|wcB|wcD|wcE|wcF
pd18=wd1|wd2|wd4|wd8
pd7e=wd7|wdB|wdD|wdE
pd3c=wd3|wd5|wd6|wd9|wdA|wdC
ga=(wa0&wb8)|((pa12)&wb0)|(wa3&wbF)
gas[0]=(!wa3&!wcF&wd0)|(wa3&!wc0&wdF)
gas[1]=(!wa3&(!wc7 !|wcB!|wcD!|wcE!|wcF)&(pd18))
gas[2]=(wa3&(!wc0!|wc1!|wc2!|wc4!|wc8)&(pd7e))
gas[3]=((wa0&pc08)|(wa3&pc7f))&(pd3c)
gas[4]=(pa12)&(wc0|wc1|wc2|wc4|wc8)&(pd3c)
gas[5]=(!wa3&wc0&(pd7e))|(wa3&wcF&(pd18))
gb=((wa0&pb9c)|(pa12&pb18)|(wa3&wb0))|
   ((pa12&wbF)|(wa3&pb7e))
gb0=!(pb7f)
gb1=(pb7f)
gbs[0]=gb0&wd0
gbs[1]=gb1&wdF
gbs[2]=wa0&(pc08)&(pd18)
gbs[3]=(gb0&!wa0)&(pc08)&(pd18)
gbs[4]=gb1&(pc7f)&(pd7e)
gbs[5]=gb0&wc0&(pd3c)
gbs[6]=gb1&wcF&(pd3c)
gc=(!ga)&(!gb)
gc0=(wa0&(wbB|wbD|wbE))|(wa3&(pb18))
gc1=(pa12)&(pb3c)
gc2=(wa0&wbF)|(wa3&(pb3c))
gc3=(pa12)&(pb7e)
gcs[0]=gc0&(pc08)&wd0
gcs[1]=gc1&(pc08)&wd0
gcs[2]=gc2&(pc7f)&wdF
gcs[3]=gc3&(pc7f)&wdF
gcs[4]=gc0&wc0&(pd18)
gcs[5]=gc1&wc0&(pd18)
gcs[6]=(wa0|gc3)&wcF&(pd7e)
gcs[7]=(!wa0&gc2)&wcF&(pd7e)
gcs[8]=(gc0|gc1)&wcF&wdF
gcs[9]=(gc2|gc3)&wc0&wd0

1.2.1.3 Group "a" Encoder 464

Group "a" encoder 464 encodes the 14-bit data segments provided on input $A_{13:0}$ into corresponding 14-bit code word segments on output $cwa_{13:0}$. These code word segments have bit patterns that are selected from a subset of the bit patterns that satisfy the desired RDS constraint.

The following logical equations describe the function of group A encoder 464:

Inputs:
A13,A12,A11,A10,A9,A8,A7,A6,A5,A4,A3,A2,A1,A0
(14-bit Data Segment)
$gas_{5:0}$ Output: $cwa_{13:0}$ (14-bit Code Word)

ga0a=gas[0]
ga0a13=0
ga0a12=0
ga0a11=0
ga0a10=0
ga0a9=ga0a & A13
ga0a8=ga0a & A12
ga0a7=ga0a & !A7
ga0a6=ga0a & !A6
ga0a5=ga0a & !A5
ga0a4=ga0a & !A4
ga0a3=ga0a
ga0a2=ga0a
ga0a1=ga0a
ga0a0=ga0a
ga1a=gas[1]
ga1a13=0
ga1a12=0
ga1a11=0
ga1a10=0
ga1a9=ga1a & A13
ga1a8=ga1a & A12
ga1a7=ga1a &!A7
ga1a6=ga1a &!A6
ga1a5=ga1a &!A5
ga1a4=ga1a &!A4
ga1a3=ga1a &!A3
ga1a2=ga1a &!A2
ga1a1=ga1a &!A1
ga1a0=ga1a & !A0
ga1b=gas[2]
ga1b13=0
ga1b12=0
ga1b11=0
ga1b10=0
ga1b9=ga1b
ga1b8=ga1b
ga1b7=ga1b & A7
ga1b6=ga1b & A6
ga1b5=ga1b & A5
ga1b4=ga1b & A4
ga1b3=ga1b &!A3
ga1b2=ga1b &!A2

```
ga1b1=ga1b &!A1
ga1b0=ga1b &!A0
ga2a=gas[3]
ga2a13=0
ga2a12=0
ga2a11=0
ga2a10=0
ga2a9=ga2a & A13
ga2a8=ga2a & A13
ga2a7=ga2a &(A13 ^ !A7)
ga2a6=ga2a &(A13 ^ !A6)
ga2a5=ga2a &(A13 ^ !A5)
ga2a4=ga2a &(A13 ^ !A4)
ga2a3=ga2a &(A13 ^ !A3)
ga2a2=ga2a &(A13 ^ !A2)
ga2a1=ga2a &(A13 ^ !A1)
ga2a0=ga2a &(A13 ^ !A0)
ga2b=gas[4]
ga2b13=0
ga2b12=0
ga2b11=0
ga2b10=ga2b&(A2&!A0)
ga2b9=ga2b &(A3 ^ !A1)
ga2b8=ga2b &(A0 &!A2)
ga2b7=ga2b &!A7
ga2b6=ga2b & !A6
ga2b5=ga2b & !A5
ga2b4=ga2b &!A4
ga2b3=ga2b &(A13 & A3)
ga2b2=ga2b &(A13 &!A3)
ga2b1=ga2b&(A12& A3)
ga2b0=ga2b &(!A13 & !A3)
ga3a=gas[5]
ga3a13=0
ga3a12=0
ga3a11=0
ga3a10=0
ga3a9=0
ga3a8=ga3a &!A10
ga3a7=ga3a & A10
ga3a6=ga3a & A13
ga3a5=ga3a & A12
ga3a4=ga3a & A11
ga3a3=ga3a & A3
ga3a2=ga3a & A2
ga3a1=ga3a & A1
ga3a0=ga3a & A0
cwa13=ga0a13|ga1a13|ga1b13|ga2a13|ga2b13|ga3a13
cwa12=ga0a12|ga1a12|ga1b12|ga2a12|ga2b12|ga3a12
cwa11=ga0a11|ga1a11|ga1b11|ga2a11|ga2b11|ga3a11
cwa10=ga0a10|ga1a10|ga1b10|ga2a10|ga2b10|ga3a10
cwa9=ga0a9|ga1a9|ga1b9|ga2a9|ga2b9|ga3a9
cwa8=ga0a8|ga1a8|ga1b8|ga2a8|ga2b8|ga3a8
cwa7=ga0a7|ga1a7|ga1b7|ga2a7|ga2b7|ga3a7
cwa6=ga0a6|ga1a6|ga1b6|ga2a6|ga2b6|ga3a6
cwa5=ga0a5|ga1a5|ga1b5|ga2a5|ga2b5|ga3a5
cwa4=ga0a4|ga1a4|ga1b4|ga2a4|ga2b4|ga3a4
cwa3=ga0a3|ga1a3|ga1b3|ga2a3|ga2b3|ga3a3
cwa2=ga0a2|ga1a2|ga1b2|ga2a2|ga2b2|ga3a2
cwa1=ga0a1|ga1a1|ga1b1|ga2a1|ga2b1|ga3a1
cwa0=ga0a0|ga1a0|ga1b0|ga2a0|ga2b0|ga3a0
```

1.2.1.4 Group "b" Encoder 466

Group "b" encoder 466 encodes the 14-bit data segments provided on input $A_{13:0}$ into corresponding 14-bit code word segments on output $cwb_{13:0}$. These code word segments have bit patterns that are selected from a different subset of the bit patterns that satisfy the desired RDS constraint.

The following logical equations describe the function of group "b" encoder 466:

Input: A13,A12,A11,A10,A9,A8,A7,A6,A5,A4,A3,A2,A1,A0

(14-bit Data Segment)

$gbs_{6:0}$

Output: $cwb_{13:0}$ (14-bit Code Word)

```
gb1a=gbs[0]
gb1a13=0
gb1a12=0
gb1a11=0
gb1a10=0
gb1a9=gb1a&(A13|(A12 & A11))
gb1a8=gb1a&(!A13 &(!A12|!A11))
gb1a7=gb1a &!A7
gb1a6=gb1a &!A6
gb1a5=gb1a &!A5
gb1a4=gb1a &!A4
gb1a3=gb1a&(A11 |(A13 & A12))
gb1a2=gb1a&(A10 |(!A11&!A8))
gb1a1=gb1a&((!A13 & (A11 ^!A9)) | (A13 & (A12 ^!A9)))
gb1a0=gb1a&((!A11 & (A9 ^ A8)) (!A13 & (A10 ^!A9)))
gb1b=gbs[1]
gb1b13=0
gb1b12=0
gb1b11=0
gb1b10=gb1b
gb1b9=0
gb1b8=0
gb1b7=gb1b & A7
gb1b6=gb1b & A6
gb1b5=gb1b & A5
gb1b4=gb1b & A4
gb1b3=gb1b &(!A10 | !A9 | !A8)
gb1b2=gb1b &(!A12 !A11 | !A8)
gb1b1=gb1b&(!A13 | !A11 | !A9)
gb1b0=gb1b &(!A13 | !A12 | !A1)
gb2a=gbs[2]
gb2a13=0
gb2a12=0
gb2a11=0
gb2a10=gb2a
gb2a9=0
gb2a8=0
gb2a7=gb2a &!A8
gb2a6=gb2a &!A9
gb2a5=gb2a &(A3 | A2)
gb2a4=gb2a &(A3 | A1)
gb2a3=gb2a &!A7
gb2a2=gb2a &!A6
gb2a1=gb2a &!A5
gb2a0=gb2a &!A4
gb2b=gbs[3]
gb2b13=0
gb2b12=0
gb2b11=0
gb2b10=gb2b
gb2b9=gb2b & A13
gb2b8=gb2b & A12
gb2b7=gb2b &(A11 | A10)
gb2b6=gb2b &(A11 | A9)
gb2b5=gb2b &(A3 | A2)
gb2b4=gb2b &(A3 | A1)
gb2b3=gb2b &!A7
gb2b2=gb2b &!A6
``` gb2b1=gb2b &!A5
gb2b0=gb2b &!A4
gb2c=gbs[4]
gb2c13=0
gb2c12=0
gb2c11=0
gb2c10=gb2c
gb2c9=gb2c &(!A10 | !| !A9 | !A8)
gb2c8=gb2c &(!A13 | !A12 | !A11)
gb2c7=gb2c &(A13 & A10)
gb2c6=gb2c&(A12& A9)
gb2c5=gb2c &(!A3 !| !A2)
gb2c4=gb2c &(!A3 | !A1)
gb2c3=gb2c &(A7 & A6)
gb2c2=gb2c &(A5 & A4)
gb2c1=gb2c&(!A6 !| !A4)
gb2c0=gb2c &(!A7 | !A5)
gb3a=gbs[5]
gb3a13=0
gb3a12=0
gb3a11=0
gb3a10=gb3a &(!A13 & !A12 & A10)
gb3a9=gb3a
gb3a8=gb3a
gb3a7=gb3a &(A13 &!A11)
gb3a6=gb3a &(A12 &!A11)
gb3a5=gb3a&(A10 |(A13 & A11))
gb3a4=gb3a&(!A8 & (A9 |(A11 & !A13)))
gb3a3=gb3a & A3
gb3a2=gb3a & A2
gb3a1=gb3a & A1
gb3a0=gb3a & A0
gb3b=gbs[6]
gb3b13=0
gb3b12=0
gb3b11=0
gb3b10=gb3b
gb3b9=gb3b&(!A10 | !A9 | !A8)
gb3b8=gb3b &(!A13 | !A12 | !A11)
gb3b7=0
gb3b6=0
gb3b5=gb3b &(A13 & A10)
gb3b4=gb3b &(A12 & A9)
gb3b3=gb3b & A3
gb3b2=gb3b & A2
gb3b1=gb3b & A1
gb3b0=gb3b & A0
cwb13=gb1a13|gb1b13|gb2a13|gb2b13|gb2c13|gb3a13|gb3b13
cwb12=gb1a12|gb1b12|gb2a12|gb2b12|gb2c12|gb3a12|gb3b12
cwb11=gb1a11|gb1b11|gb2a11|gb2b11|gb2c11|gb3a11|gb3b11
cwb10=gb1a10|gb1b10|gb2a10|gb2b10|gb2c10|gb3a10|gb3b10
cwb9=gb1a9|gb1b9|gb2a9|gb2b9|gb2c9|gb3a9|gb3b9
cwb8=gb1a8|gb1b8|gb2a8|gb2b8|gb2c8|gb3a8|gb3b8
cwb7=gb1a7|gb1b7|gb2a7|gb2b7|gb2c7|gb3a7|gb3b7
cwb6=gb1a6|gb1b6|gb2a6|gb2b6|gb2c6|gb3a6|gb3b6
cwb5=gb1a5|gb1b5|gb2a5|gb2b5|gb2c5|gb3a5|gb3b5
cwb4=gb1a4|gb1b4|gb2a4|gb2b4|gb2c4|gb3a4|gb3b4
cwb3=gb1a3|gb1b3|gb2a3|gb2b3|gb2c3|gb3a3|gb3b3
cwb2=gb1a2|gb1b2|gb2a2|gb2b2|gb2c2|gb3a2|gb3b2
cwb1=gb1a1|gb1b1|gb2a1|gb2b1|gb2c1|gb3a1|gb3b1
cwb0=gb1a0|gb1b0|gb2a0|gb2b0|gb2c0|gb3a0|gb3b0

1.2.1.5 Group "c" Encoder 468

Group "c" encoder 468 encodes the 14-bit data segments provided on input $A_{13:0}$ into corresponding 14-bit code word segments on output $cwc_{13:0}$. These code word segments have bit patterns that are selected from a different subset of the bit patterns that satisfy the desired RDS constraint than were used by the group "a" and "b" encoders.

The following logical equations describe the function of group "c" encoder 468:

Input:
A13,A12,A11,A10,A9,A8,A7,A6,A5,A4,A3,A2,A1,A0
(14-bit Data Segment)
$gcs_{9:0}$ Output:
$cwc_{13:0}$
(14-bit Code Word Segment)
gc1a=gcs[0]
gc1a13=0
gc1a12=0
gc1a11=0
gc1a10=gc1a
gc1a9=gc1a
gc1a8=gc1a
gc1a7=gc1a & !A13
gc1a6=gc1a &(A10 | !A8)
gc1a5=gc1a &(A13^ A9)
gc1a4=gc1a &(A8 | !A10)
gc1a3=gc1a & A7
gc1a2=gc1a & A6
gc1a1=gc1a & A5
gc1a0=gc1a & A4
gc1b=gcs[1]
gc1b13=0
gc1b12=0
gc1b11=0
gc1b10=gc1b
gc1b9=gc1b&(A13 |(A11 & A10))
gc1b8=gc1b&(!A13 |(A11 & A10))
gc1b7=gc1b &(A11 | A10)
gc1b6=gc1b &(A11 | A9)
gc1b5=gc1b&(A8 |(!A10 |(A13 & A11)))
gc1b4=gc1b&(A9 |(!A11 |(A13 & A10)))
gc1b3=gc1b & A7
gc1b2=gc1b & A6
gc1b1=gc1b & A5
gc1b0=gc1b & A4
gc1c=gcs[2]
gc1c13=0
gc1c12=0
gc1c11=0
gc1c10=gc1c & A13
gc1c9=gc1c &(!A13 | !A11)
gc1c8=gc1c &(!A13 | !A11)
gc1c7=gc1c &(!A13 | !A11)
gc1c6=gc1c &(!A13 | !A11)
gc1c5=gc1c &(!A13 | !A8)
gc1c4=gc1c &(!A13 | !A9)
gc1c3=gc1c & A7
gc1c2=gc1c & A6
gc1c1=gc1c & A5
gc1c0=gc1c & A4
gc1d=gcs[3]
gc1d13=0
gc1d12=0
gc1d11=0
gc1d10=gc1d

```
gc1d9=gc1d
gc1d8=gc1d
gc1d7=gc1d & A13
gc1d6=gc1d &!A13
gc1d5=gc1d &(!A9 | !A8)
gc1d4=gc1d&(!A10 | !A8)
gc1d3=gc1d & A7
gc1d2=gc1d & A6
gc1d1=gc1d & A5
gc1d0=gc1d & A4
gc2a=gcs[4]
gc2a13=0
gc2a12=0
gc2a11=0
gc2a10=gc2a
gc2a9=gc2a
gc2a8=gc2a & A13
gc2a7=gc2a&(A11 &(A13 | A10))
gc2a6=gc2a &((A13 & A10)|(!A13 & A9))
gc2a5=gc2a&((!A13 & (A3 ^ A2)) | (A13 & (A13^!A9)))
gc2a4=gc2a&((!A13 & (A3 ^ A1)) | (A13 & (A13 ^!A8)))
gc2a3=gc2a &(A13 & A3)
gc2a2=gc2a &(A13 & A2)
gc2a1=gc2a &(A1 | !A13)
gc2a0=gc2a &(A0 | !A13)
gc2b=gcs[5]
gc2b13=0
gc2b12=0
gc2b11=0
gc2b10=gc2b
gc2b9=gc2b& A13
gc2b8=gc2b & !A13
gc2b7=gc2b & A11
gc2b6=gc2b & A10
gc2b5=gc2b & A9
gc2b4=gc2b & A8
gc2b3=gc2b & A3
gc2b2=gc2b & A2
gc2b1=gc2b,& A1
gc2b0=gc2b & A0
gc2c=gcs[6]
gc2c13=0
gc2c12=0
gc2c11=0
gc2c10=0
gc2c9=gc2c
gc2c8=gc2c
gc2c7=gc2c & A13
gc2c6=gc2c & A12
gc2c5=gc2c &(!A9 | !A8)
gc2c4=gc2c &(!A10 | !A8)
gc2c3=gc2c & A3
gc2c2=gc2c & A2
gc2c1=gc2c & A1
gc2c0=gc2c & A0
gc2d=gcs[7]
gc2d13=0
gc2d12=0
gc2d11=0
gc2d10=0
gc2d9=gc2d
gc2d8=gc2d
gc2d7=gc2d & A11
gc2d6=gc2d & A11
gc2d5=gc2d & A10
gc2d4=gc2d & A9
gc2d3=gc2d & A3
gc2d2=gc2d & A2
gc2d1=gc2d & A1
gc2d0=gc2d & A0
gc3a=gcs[8]
gc3a13=0
gc3a12=0
gc3a11=0
gc3a10=gc3a
gc3a9=gc3a
gc3a8=gc3a
gc3a7=gc3a&((!A13 & (A13 ^ A11)) | (A13 & (A12 ^ A11)))
gc3a6=gc3a&((!A13 & (A13 ^ A10)) | (A13 & (A12 ^ A10)))
gc3a5=gc3a&((!A13 & (A13^A9)) | (A13 & (A12^A9)))
gc3a4=gc3a&((!A13 & (A13^A8)) | (A13 & (A12^A8)))
gc3a3=gc3a &(A13 | A12)
gc3a2=gc3a &(A13 & A12)
gc3a1=gc3a & !A12
gc3a0=gc3a & !A13
gc3b=gcs[9]
gc3b13=0
gc3b12=0
gc3b11=0
gc3b10=gc3b
gc3b9=gc3b
gc3b8=gc3b
gc3b7=gc3b & A11
gc3b6=gc3b & A10
gc3b5=gc3b & A9
gc3b4=gc3b & A8
gc3b3=gc3b &(A13 & A12)
gc3b2=gc3b &(A13 | A12)
gc3b1=gc3b & !A12
gc3b0=gc3b & !A13
cwc13=gc1a13|gc1b13|gc1c13|gc1d13|gc2a13|gc2b13|
    gc2c13|gc2d13|gc3a13|gc3b13
cwc12=gc1a12|gc1b12|gc1c12|gc1d12|gc2a12|gc2b12|
    gc2c12|gc2d12|gc3a12|gc3b12
cwc11=gc1a11|gc1b11|gc1c11|gc1d11|gc2a11|gc2b11|
    gc2c11|gc2d11|gc3a11|gc3b11
cwc10=gc1a10|gc1b10|gc1c10|gc1d10|gc2a10|gc2b10|
    gc2c10|gc2d10|gc3a10|gc3b10
cwc9=gc1a9|gc1b9|gc1c9|gc1d9|gc2a9|gc2b9|gc2c9|
    gc2d9|gc3a9|gc3b9
cwc8=gc1a8|gc1b8|gc1c8|gc1d8|gc2a8|gc2b8|gc2c8|
    gc2d8|gc3a8|gc3b8
cwc7=gc1a7|gc1b7|gc1c7|gc1d7|gc2a7|gc2b7|gc2c7|
    gc2d7|gc3a7|gc3b7
cwc6=gc1a6|gc1b6|gc1c6|gc1d6|gc2a6|gc2b6|gc2c6|
    gc2d6|gc3a6|gc3b6
cwc5=gc1a5|gc1b5|gc1c5|gc1d5|gc2a5|gc2b5|gc2c5|
    gc2d5|gc3a5|gc3b5
cwc4=gc1a4|gc1b4|gc1c4|gc1d4|gc2a4|gc2b4|gc2c4|
    gc2d4|gc3a4|gc3b4
cwc3=gc1a3|gc1b3|gc1c3|gc1d3|gc2a3|gc2b3|gc2c3|
    gc2d3|gc3a3|gc3b3
cwc2=gc1a2|gc1b2|gc1c2|gc1d2|gc2a2|gc2b2|gc2c2|
    gc2d2|gc3a2|gc3b2
cwc1=gc1a1|gc1b1|gc1c1|gc1d1|gc2a1|gc2b1|gc2c1|
    gc2d1|gc3a1|gc3b1
cwc0=gc1a0|gc1b0|gc1c0|gc1d0|gc2a0|gc2b0|gc2c0|
    gc2d0|gc3a0|gc3b0
```

1.2.1.6 Multiplexer 470

The following logical equations describe the function of multiplexer 470:

Input: $A_{13:0}$, $cwa_{13:0}$, $cwb_{13:0}$, $cwc_{13:0}$, tt, ga, gb, gc

Output: $CW_{13:0}$

If (tt==1) $CW_{13:0}=A_{13:0}$
If (!tt & ga) $CW_{13:0}=cwa_{13:0}$
If (!tt & gb) $CW_{13:0}=cwb_{13:0}$
If (!tt & gc) $CW_{13:0}=cwc_{13:0}$

1.2.2 Segment Encoder "B" 452

Referring back to FIG. 6, segment encoder "B" 452 uses the remaining 14-bit patterns that satisfy the RDS constraint and were not used by the group "a" encoder 464, group "b" encoder 466 or group "c" encoder 468 (shown in FIG. 7), so as to further encode the intermediate code word segment $CA_{13:0}$ to satisfy a second constraint, such as a "k" constraint.

Figure 8:
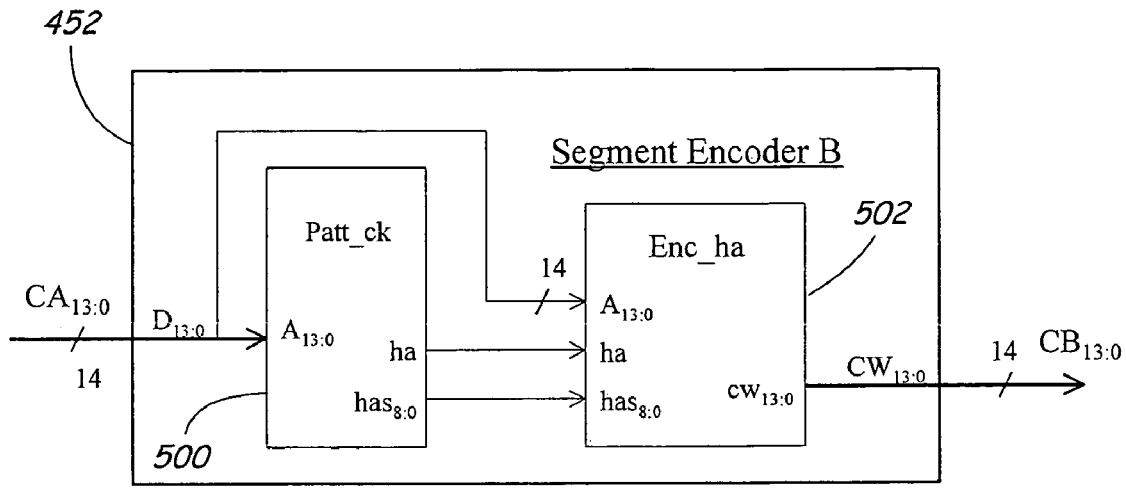
FIG. 8 is a block diagram, which illustrates a segment encoder "B" within the segment encoder shown in FIG. 6.

FIG. 8 is a block diagram illustrating segment encoder "B" (452) in greater detail. Segment encoder "B" has the following inputs and outputs:

Input:
D13,D12,D11,D10,D9,D8,D7,D6,D5,D4,D3,D2,D1,D0
(14-bit Data Segment)

Output:
$CW_{13:0}$
(14-bit Code Word Segment)

Segment encoder "B" includes pattern check circuit 500 and HA encoder 502.

1.2.2.1 Pattern Check Circuit 500

Pattern check circuit 500 checks the pattern formed by the incoming intermediate code word segment $CA_{13:0}$ and determines whether that pattern already satisfies the k-constraint. In this example, the k-constraint limits the distance between transitions to fourteen bit positions. If the incoming bit pattern already satisfies the k-constraint (and therefore is not a member of a group to be further encoded), pattern check circuit 450 sets output flag ha to "false". If the incoming bit pattern does not satisfy the k-constraint, pattern check circuit 500 divides the input bit pattern into nine groups, for example, and determines which of the nine groups is a problem. Group select word $has_{8:0}$ identifies the corresponding group.

The following logical equations describe the function performed by pattern check circuit 500.

Input:
A13,A12,A11,A10,A9,A8,A7,A6,A5,A4,A3,A2,A1,A0
(14-bit Data Segment)
Output:
ha, $has_{8:0}$

| | |
|---|---|
| wa3= A13& A12 | wa2= A13&!A12 |
| wa1=!A13& A12 | wa0=!A13&!A12 |
| wbF= A11& A10& A9& A8 | wbE= A11& A10& A9&!A8 |
| wbD= A11& A10&!A9& A8 | wbC= A11& A10&!A9&!A8 |
| wbB= A11&!A10& A9& A8 | wbA= A11&!A10& A9&!A8 |
| wb9= A11&!A10&!A9& A8 | wb8= A11&!A10&!A9&!A8 |
| wb7=!A11& A10& A9& A8 | wb6=!A11& A10& A9&!A8 |
| wb5=!A11& A10&!A9& A8 | wb4=!A11& A10&!A9&!A8 |
| wb3=!A11&!A10& A9& A8 | wb2=!A11&!A10& A9&!A8 |
| wb1=!A11&!A10&!A9& A8 | wb0=!A11&!A10&!A9&!A8 |
| wcF= A7& A6& A5& A4 | wcE= A7& A6& A5&!A4 |
| wcD= A7& A6&!A5& A4 | wcC= A7& A6&!A5&!A4 |
| wcB= A7&!A6& A5& A4 | wcA= A7&!A6& A5&!A4 |
| wc9= A7&!A6&!A5& A4 | wc8= A7&!A6&!A5&!A4 |
| wc7=!A7& A6& A5& A4 | wc6=!A7& A6& A5&!A4 |
| wc5=!A7& A6&!A5& A4 | wc4=!A7& A6&!A5&!A4 |
| wc3=!A7&!A6& A5& A4 | wc2=!A7&!A6& A5&!A4 |
| wc1=!A7&!A6&!A5& A4 | wc0=!A7&!A6&!A5&!A4 |
| wdF= A3& A2& A1& A0 | wdE= A3& A2& A1&!A0 |
| wdD= A3& A2&!A1& A0 | wdC= A3& A2&!A1&!A0 |
| wdB= A3&!A2& A1& A0 | wdA= A3&!A2& A1&!A0 |
| wd9= A3&!A2&!A1& A0 | wd8= A3&!A2&!A1&!A0 |
| wd7=!A3& A2& A1& A0 | wd6=!A3& A2& A1&!A0 |
| wd5=!A3& A2&!A1& A0 | wd4=!A3& A2&!A1&!A0 |
| wd3=!A3&!A2& A1& A0 | wd2=!A3&!A2& A1&!A0 |
| wd1=!A3&!A2&!A1& A0 | wd0=!A3&!A2&!A1&!A0 | pab00=wa0&wb0
pab3f=wa3&wbF
pcd00=wc0&wd0
pcdff=wcF&wdF
pd08=wd0|wd1|wd2|wd4|wd8
pd7f=wd7|wdB|wdD|wdE|wdF
h10=(wc1|wc2)&wdF
h11=(A13|A12)&wbF
h20=(wa0&(wb1|wb3|wb5|wb9))|((wa1|wa2)&wb1)
h40=(wa0|wa1|wa2)&(wb0|wb4|wb8)
h41=(wa3&wb0)|(wa0&wbC)
h42=((wa0|wa1|wa2)&wb2)|(wa0&(wb6|wbA))
has[0]=(pab00&(h10|(wc3&pd7f)))|(h11&pcd00)
has[1]=wa3&(wb7|wbB|wbD|wbE)&pcd00
has[2]=pab3f&((wcE&pd08)|(wcF&wd0))
has[3]=h20&pcdff
has[4]=pab3f&wcC&!pd7f
has[5]=pab3f&wcD& pd08
has[6]=(h40|h41)&pcdff
has[7]=h42&pcdff
has[8]=(wa1&wb5&wc5&wd5)|
  (wa2&wbA&wcA&wdA)
ha=has[0] | has[1] | has[2] | has[3] | has[4] | has[5] | has[6] | has[7] | has[8]

1.2.2.2 HA Encoder 502

HA encoder 502 receives the intermediate code word segment $CA_{13:0}$ on input $A_{13:0}$ and further encodes the segments so as to satisfy the k-constraint, based on which group $has_{8:0}$ has been identified by pattern check circuit 500. The code word segments $CW_{13:0}$ are encoded with the remaining, unused 14-bit code words that satisfy the RDS constraint and also satisfy the desired k-constraint.

If flag "ha" is false, the incoming code word segment $CA_{13:0}$ requires no further encoding.

The following logical equations describe the function performed by HA Encoder 502:

Input:
A13,A12,A11,A10,A9,A8,A7,A6,A5,A4,A3,A2,A1,A0
(14-bit Data Segment)
$has_{8:0}$, ha Output:
$CW_{13:0}$
(14-bit Code Word)
ha1a=has[0]
ha1a13=0
ha1a12=0
ha1a11=0
ha1a10=ha1a &(A13 & A12)
ha1a9=ha1a&(A5 |(A13 &!A12)
ha1a8=ha1a&(A4 |(!A13 &!A5))
ha1a7=ha1a & A3
ha1a6=ha1a & A2
ha1a5=ha1a & A1 ha1a4=ha1a & A0
ha1a3=ha1a & A11
ha1a2=ha1a & A11
ha1a1=ha1a & A11
ha1a0=ha1a & A11
ha1b=has[1]
ha1b13=0
ha1b12=0
ha1b11=0
ha1b10=0
ha1b9=0
ha1b8=ha1b
ha1b7=ha1b
ha1b6=0
ha1b5=0
ha1b4=0
ha1b3=ha1b & A11
ha1b2=ha1b & A10
ha1b1=ha1b & A9
ha1b0=ha1b & A8
ha2a=has[2]
ha2a13=0
ha2a12=0
ha2a11=0
ha2a10=0
ha2a9=ha2a
ha2a8=0
ha2a7=0
ha2a6=0
ha2a5=ha2a &(!A3 & !A2 & !A1 & !A0)
ha2a4=ha2a &(A3 | A2 | A1 | A0)
ha2a3=ha2a &(A4 | A2 | A1 | A0)
ha2a2=ha2a &(!A4 & !A2)
ha2a1=ha2a & !A1
ha2a0=ha2a & !A0
ha2b=has[3]
ha2b13=0
ha2b12=0
ha2b11=0
ha2b10=0
ha2b9=ha2b
ha2b8=0
ha2b7=0
ha2b6=ha2b &(A13 | A12 | A11 | A10)
ha2b5=ha2b &(!A13 & !A12 & !A11 & !A10)
ha2b4=0
ha2b3=ha2b &!A10
ha2b2=ha2b &!A11
ha2b1=ha2b &(!A12 & !A9)
ha2b0=ha2b &(A12 | A11 | A10 | A9)
ha3a=has[4]
ha3a13=0
ha3a12=0
ha3a11=0
ha3a10=ha3a
ha3a9=ha3a
ha3a8=ha3a
ha3a7=ha3a
ha3a6=0
ha3a5=0
ha3a4=ha3a&((!A5 & (A13 ^ A3)) | (!A2 & (A1 ^!A0)))
ha3a3=ha3a & A3
ha3a2=ha3a & A2
ha3a1=ha3a & A1
ha3a0=ha3a & A0
ha3b=has[5]
ha3b13=0
ha3b12=0
ha3b11=0
ha3b10=ha3b
ha3b9=0
ha3b8=ha3b
ha3b7=ha3b & !A3
ha3b6=ha3b & !A2
ha3b5=ha3b &!A1
ha3b4=ha3b & !A0
ha3b3=0
ha3b2=0
ha3b1=ha3b
ha3b0=ha3b
ha4a=has[6]
ha4a13=0
ha4a12=0
ha4a11=0
ha4a10=ha4a
ha4a9=ha4a
ha4a8=ha4a
ha4a7=ha4a&((!A13 & (A12 ^!A11)) | (!A10 &(A13 ^!A13)))
ha4a6=0
ha4a5=ha4a
ha4a4=0
ha4a3=ha4a & A10
ha4a2=ha4a & A11
ha4a1=ha4a & A12
ha4a0=ha4a & A13
ha4b=has[7]
ha4b13=0
ha4b12=0
ha4b11=0
ha4b10=ha4b
ha4b9=ha4b
ha4b8=ha4b
ha4b7=ha4b
ha4b6=ha4b
ha4b5=ha4b
ha4b4=ha4b
ha4b3=ha4b& !A10
ha4b2=ha4b &(A13 | A12 | A10)
ha4b1=ha4b &(A13 | A11 | A10)
ha4b0=ha4b & !A13
ha5a=has[8]
ha5a13=0
ha5a12=0
ha5a11=0
ha5a10=ha5a
ha5a9=0
ha5a8=ha5a
ha5a7=ha5a & A13
ha5a6=ha5a & !A13
ha5a5=ha5a & !A13
ha5a4=ha5a & A13
ha5a3=0
ha5a2=0
ha5a1=ha5a
ha5a0=ha5a
cwh[13]=ha1a13|ha1b13|ha2a13|ha2b13|ha3a13|ha3b13| ha4a13| ha4b13|ha5a13
cwh[12]=ha1a12|ha1b12|ha2a12|ha2b12|ha3a12|ha3b12| ha4a12|ha4b12|ha5a12
cwh[11]=ha1a11|ha1b11|ha2a11|ha2b11|ha3a11|ha3b11| ha4a11|ha4b11|ha5a11
cwh[10]=ha1a10|ha1b10|ha2a10|ha2b10|ha3a10|ha3b10| ha4a10|ha4b10|ha5a10 cwh[9]=ha1a9|ha1b9|ha2a9|ha2b9|ha3a9|ha3b9|ha4a9|
ha4b9|ha5a9 cwh[8]=ha1a8|ha1b8|ha2a8|ha2b8|ha3a8|ha3b8|ha4a8|
ha4b8|ha5a8 cwh[7]=ha1a7|ha1b7|ha2a7|ha2b7|ha3a7|ha3b7|ha4a7|
ha4b7|ha5a7 cwh[6]=ha1a6|ha1b6|ha2a6|ha2b6|ha3a6|ha3b6|ha4a6|
ha4b6|ha5a6 cwh[5]=ha1a5|ha1b5|ha2a5|ha2b5|ha3a5|ha3b5|ha4a5|
ha4b5|ha5a5 cwh[4]=ha1a4|ha1b4|ha2a4|ha2b4|ha3a4|ha3b4|ha4a4|
ha4b4|ha5a4 cwh[3]=ha1a3|ha1b3|ha2a3|ha2b3|ha3a3|ha3b3|ha4a3|
ha4b3|ha5a3 cwh[2]=ha1a2|ha1b2|ha2a2|ha2b2|ha3a2|ha3b2|ha4a2|
ha4b2|ha5a2 cwh[1]=ha1a1|ha1b1|ha2a1|ha2b1|ha3a1|ha3b1|ha4a1|
ha4b1|ha5a1 cwh[0]=ha1a0|ha1b0|ha2a0|ha2b0|ha3a0|ha3b0|ha4a0|
ha4b0|ha5a0 if(ha) $cw_{13:0}=cwh_{13:0}$ else $cw_{13:0}=A_{13:0}$ 1.2.3 Inverter for Hamming Weight=10

Referring back to FIG. 6, inverter block 454 selectively inverts the code word segments $CB_{13:0}$ for every other code word segment having a hamming weight of 10 (i.e., RDS=6). Inverter 454 maintains a state flag "st" that is toggled for each occurrence of a code word having a hamming weight of 10. Depending on a state of "st", the incoming code word segment $CB_{13:0}$ is selectively inverted.

The following logical equations describe the function performed by inverter 454:

Input:
A13,A12,A11,A10,A9,A8,A7,A6,A5,A4,A3,A2,A1,A0
(14-bit Code Word Segment)

Output:
$C_{13:0}$
(14-bit Code Word Segment)

The digital signal "st" is initialized to 0 at the beginning of a sector.

if(Hamming weight of $A_{13:0==10}$)

| | | |
|---|---|---|
| { | if( st==1 ) | $C_{13:0} = !A_{13:0}$ |
| | else | $C_{13:0} = A_{13:0}$ |
| | st = st^1 | |
| } | | |

2. Decoder 400

The following subsections provide implementations of the segment decoders 406 and 15-bit to 14-bit decoder 408 shown in FIGS. 4 and 5, according to one embodiment of the present invention.

2.1 Segment Decoder 406

Each segment decoder 406 has the following inputs and outputs:

Input:
C13,C12,C11,C10,C9,C8,C7,C6,C5,C4,C3,C2,C1,C0
(14-bit Code Word Segment)

Output:
D13,D12,D11,D10,D9,D8,D7,D6,D5,D4,D3,D2,D1,D0
(14-bit Data Segment)

Each segment decoder 406 includes an inverter circuit 600, a segment decoder "B" 602 and a segment decoder "A" 604, which are described in the following subsections.

2.1.1 Inverter Circuit 600

Each code word segment $C_{13:0}$ is applied to inverter circuit 600, which checks the bit pattern for a hamming weight of 4. A hamming weight of 4 represents a code word segment having an invalid RDS of −6. This invalid RDS represents the code word with an RDS=+6 that was selectively inverted by inverter circuit 454 in the segment encoder 204 shown in FIG. 6. If the incoming code word segment $C_{13:0}$ has a hamming weight of 4, inverter circuit 600 inverts the incoming code word to produce segment $DH_{13:0}$. If the hamming weight is not 4, the incoming code word segments are passed through without inversion.

The following logical equations define the function performed by inverter 600 according to one embodiment of the present invention:

Input:
C13,C12,C11,C10,C9,C8,C7,C6,C5,C4,C3,C2,C1,C0
(14-bit Code Word Segment)

Output:
D13,D12,D11,D10,D9,D8,D7,D6,D5,D4,D3,D2,D1,D0
(14-bit selectively inverted Word Code Word Segment)

if(Hamming weight of A13:0==4) $DH_{13:0}=!C_{13:0}$ else $DH_{13:0}=C_{13:0}$ 2.1.2 Segment Decoder "B" 602

Segment decoder "B" has the following inputs and outputs:

Input:
A13,A12,A11,A10,A9,A8,A7,A6,A5,A4,A3,A2,A1,A0
(14-bit Word)

Output: D13,D12,D11,D10,D9,D8,D7,D6,D5,D4,D3,D2,
D1,D0 (14-bit Word)

Segment decoder "B" 602 applies the inverse of the coding rules applied by segment encoder "B" 452 shown in FIGS. 6 and 8 (enforcing the k-constraint).

Figure 10:
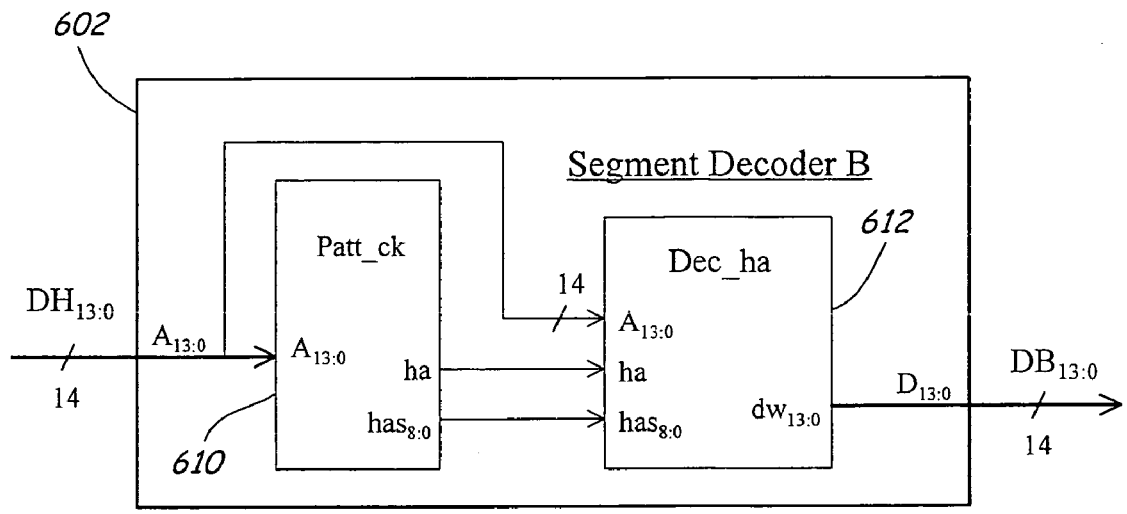
FIG. 10 is a block diagram, which illustrates a segment decoder "B" within the segment decoder shown in FIG. 9.

FIG. 10 is a block diagram illustrating segment decoder "B" 602 in greater detail. Segment decoder "B" includes pattern check circuit 610 and HA decoder 612.

2.1.2.1 Pattern Check Circuit 610

Pattern check circuit 610 checks the bit pattern of word segment $DH_{13:0}$ received on input $A_{13:0}$ and identifies whether that pattern corresponds to one of nine groups of patterns used by segment encoder "B". If so, pattern check circuit 610 asserts flag "ha" and asserts the corresponding bit in $has_{8:0}$.

The following logical equations describe the function performed by pattern check circuit 610.

Input:
A13,A12,A11,A10,A9,A8,A7,A6,A5,A4,A3,A2,A1,A0
(14-bit Word)

Output:
ha, $has_{8:0}$ wa0=!A13&!A12
wbF= A11& A10& A9& A8      wbE= A11& A10& A9&!A8
wbD= A11& A10&!A9& A8      wbC= A11& A10&!A9&!A8
wbB= A11&!A10& A9& A8      wbA= A11&!A10& A9&!A8
wb9= A11&!A10&!A9& A8      wb8= A11&!A10&!A9&!A8
wb7=!A11& A10& A9& A8      wb6=!A11& A10& A9&!A8

-continued

| | |
|---|---|
| wb5=!A11& A10&!A9& A8 | wb4=!A11& A10&!A9&!A8 |
| wb3=!A11&!A10& A9& A8 | wb2=!A11&!A10& A9&!A8 |
| wb1=!A11&!A10&!A9& A8 | wb0=!A11&!A10&!A9&!A8 |
| wcF= A7& A6& A5& A4 | wcE= A7& A6& A5&!A4 |
| wcD= A7& A6&!A5& A4 | wcC= A7& A6&!A5&!A4 |
| wcB= A7&!A6& A5& A4 | wcA= A7&!A6& A5&!A4 |
| wc9= A7&!A6&!A5& A4 | wc8= A7&!A6&!A5&!A4 |
| wc7=!A7& A6& A5& A4 | wc6=!A7& A6& A5&!A4 |
| wc5=!A7& A6&!A5& A4 | wc4=!A7& A6&!A5&!A4 |
| wc3=!A7&!A6& A5& A4 | wc2=!A7&!A6& A5&!A4 |
| wc1=!A7&!A6&!A5& A4 | wc0=!A7&!A6&!A5&!A4 |
| wdF= A3& A2& A1& A0 | wdE= A3& A2& A1&!A0 |
| wdD= A3& A2&!A1& A0 | wdC= A3& A2&!A1&!A0 |
| wdB= A3&!A2& A1& A0 | wdA= A3&!A2& A1&!A0 |
| wd9= A3&!A2&!A1& A0 | wd8= A3&!A2&!A1&!A0 |
| wd7=!A3& A2& A1& A0 | wd6=!A3& A2& A1&!A0 |
| wd5=!A3& A2&!A1& A0 | wd4=!A3& A2&!A1&!A0 |
| wd3=!A3&!A2& A1& A0 | wd2=!A3&!A2& A1&!A0 |
| wd1=!A3&!A2&!A1& A0 | wd0=!A3&!A2&!A1&!A0 | pab01=wa0&wb1
pab02-=wa0&wb2
pab03=wa0&wb3
pab04=wa0&wb4
pab05=wa0&wb5
pab07=wa0&wb7
pc7f=wc7|wcB|wcD|wcE|wcF
pd08=wd0|wd1|wd2|wd3|wd4|wd5|wd6|wd8
pd7e=wd7|wdB|wdD|wdE
pd9c=wd9|wdA|wdC
h10=(pab01|pab02)&wcF&wd0
h11=pab03&pc7f&wd0
h12=(pab01|pab02|pab04)&wc0&wdF
has[0]=h10|h11|h12
has[1]=pab01&wc8&pd7e
has[2]=pab02&((wc1&pd7e)|(wc2&(wd7|wdB)))
has[3]=pab02&((wc4&pd7e)|(wc2&(wdD|wdE)))
has[4]=pab07&((wc9&pd08)|(wc8&pd9c))
has[5]=pab05&pc7f&wd3
has[6]=pab07&((wcA&pd08)|(wc2&pd9c))
has[7]=pab07&wcF&(pd7e|wd9)
has[8]=pab05&(wc6|wc9)&wd3
ha=has[0]|has[1]|has[2]|has[3]|has[4]|has[5]|has[6]|has[7]|has[8]

2.1.2.2 HA Decoder 612

HA decoder 612 performs the inverse of the coding rules applied by HA encoder 502 shown in FIG. 8. Depending on which group is identified by $has_{8:0}$ or flag "ha", HA decoder 612 decodes input $A_{13:0}$ to produce a 14-bit word $DW_{13:0}$.

The following logical equations describe the function performed by HA decoder 612:

Input:
   A13,A12,A11,A10,A9,A8,A7,A6,A5,A4,A3,A2,A1,A0 (14-bit Word)
   $has_{8:0}$, ha Output:
   $dW_{13:0}$ (14-bit Word)
   ha1a=has[0]
   ha1a13=ha1a &(!A8 &!A7)
   ha1a12=ha1a &(!A9 &!A7)
   ha1a11=ha1a & A3
   ha1a10=ha1a & A3
   ha1a9=ha1a & A3
   ha1a8=ha1a & A3
   ha1a7=0
   ha1a6=0
   ha1a5=ha1a &(A9 &!A3)
   ha1a4=ha1a &(A8 &!A3)
   ha1a3=ha1a & A7
   ha1a2=ha1a & A6
   ha1a1=ha1a & A5
   ha1a0=ha1a & A4
   ha1b=has[1]
   ha1b13=ha1b
   ha1b12=ha1b
   ha1b11=ha1b & A3
   ha1b10=ha1b & A2
   ha1b9=ha1b & A1
   ha1b8=ha1b & A0
   ha1b7=0
   ha1b6=0
   ha1b5=0
   ha1b4=0
   ha1b3=0
   ha1b2=0
   ha1b1=0
   ha1b0=0
   ha2a=has[2]
   ha2a13=ha2a
   ha2a12=ha2a
   ha2a11=ha2a
   ha2a10=ha2a
   ha2a9=ha2a
   ha2a8=ha2a
   ha2a7=ha2a
   ha2a6=ha2a
   ha2a5=ha2a
   ha2a4=ha2a &(A5 & A3)
   ha2a3=ha2a &(!A5 & !A3)
   ha2a2=ha2a &(!A5 & !A2)
   ha2a1=ha2a & !A1
   ha2a0=ha2a & !A0
   ha2b=has [3]
   ha2b13=ha2b &(A6 & !A0)
   ha2b12=ha2b &(A6 & !A1)
   ha2b11=ha2b &!A2
   ha2b10=ha2b &!A3
   ha2b9=ha2b &(!A6 & !A1)
   ha2b8=ha2b
   ha2b7=ha2b
   ha2b6=ha2b
   ha2b5=ha2b
   ha2b4=ha2b
   ha2b3=ha2b
   ha2b2=ha2b
   ha2b1=ha2b
   ha2b0=ha2b
   ha3a=has[4]
   ha3a13=ha3a
   ha3a12=ha3a
   ha3a11=ha3a
   ha3a10=ha3a
   ha3a9=ha3a
   ha3a8=ha3a
   ha3a7=ha3a
   ha3a6=ha3a
   ha3a5=0
   ha3a4=0
   ha3a3=ha3a & A3
   ha3a2=ha3a & A2
   ha3a1=ha3a & A1
   ha3a0=ha3a & A0
   ha3b=has [5]

ha3b13=ha3b
ha3b12=ha3b
ha3b11=ha3b
ha3b10=ha3b
ha3b9=ha3b
ha3b8=ha3b
ha3b7=ha3b
ha3b6=ha3b
ha3b5=0
ha3b4=ha3b
ha3b3=ha3b &!A7
ha3b2=ha3b & !A6
ha3b1=ha3b & !A5
ha3b0=ha3b & !A4
ha4a=has[6]
ha4a13=ha4a & A0
ha4a12=ha4a & A1
ha4a11=ha4a & A2
ha4a10=ha4a & A3
ha4a9=0
ha4a8=0
ha4a7=ha4a
ha4a6=ha4a
ha4a5=ha4a
ha4a4=ha4a
ha4a3=ha4a
ha4a2=ha4a
ha4a1=ha4a
ha4a0=ha4a
ha4b=has[7]
ha4b13=ha4b & !A0
ha4b12=ha4b &(A2 &!A1)
ha4b11=ha4b &(A1 &!A2)
ha4b10=ha4b & !A3
ha4b9=ha4b
ha4b8=0
ha4b7=ha4b
ha4b6=ha4b
ha4b5=ha4b
ha4b4=ha4b
ha4b3=ha4b
ha4b2=ha4b
ha4b1=ha4b
ha4b0=ha4b
ha5a=has[8]
ha5a13=ha5a & A7
ha5a12=ha5a & !A7
ha5a11=ha5a & A7
ha5a10=ha5a &!A7
ha5a9=ha5a & A7
ha5a8=ha5a &!A7
ha5a7=ha5a & A7
ha5a6=ha5a & !A7
ha5a5=ha5a & A7
ha5a4=ha5a & !A7
ha5a3=ha5a & A7
ha5a2=ha5a&!A7
ha5a1=ha5a & A7
ha5a0=ha5a & !A7
dw[13]=ha1a13|ha1b13|ha2a13|ha2b13|ha3a13|ha3b13|ha4a13|ha4b13|ha5a13
dw[12]=ha1a12|ha1b12|ha2a12|ha2b12|ha3a12|ha3b12|ha4a12|ha4b12|ha5a12
dw[11]=ha1a11|ha1b11|ha2a11|ha2b11|ha3a11|ha3b11|ha4a11|ha4b11|ha5a11
dw[10]=ha1a10|ha1b10|ha2a10|ha2b10|ha3a10|ha3b10|ha4a10|ha4b10|ha5a10
dw[9]=ha1a9|ha1b9|ha2a9|ha2b9|ha3a9|ha3b9|ha4a9|ha4b9|ha5a9
dw[8]=ha1a8|ha1b8|ha2a8|ha2b8|ha3a8|ha3b8|ha4a8|ha4b8|ha5a8
dw[7]=ha1a7|ha1b7|ha2a7|ha2b7|ha3a7|ha3b7|ha4a7|ha4b7|ha5a7
dw[6]=ha1a6|ha1b6|ha2a6|ha2b6|ha3a6|ha3b6|ha4a6|ha4b6|ha5a6
dw[5]=ha1a5|ha1b5|ha2a5|ha2b5|ha3a5|ha3b5|ha4a5|ha4b5|ha5a5
dw[4]=ha1a4|ha1b4|ha2a4|ha2b4|ha3a4|ha3b4|ha4a4|ha4b4|ha5a4
dw[3]=ha1a3|ha1b3|ha2a3|ha2b3|ha3a3|ha3b3|ha4a3|ha4b3|ha5a3
dw[2]=ha1a2|ha1b2|ha2a2|ha2b2|ha3a2|ha3b2|ha4a2|ha4b2|ha5a2
dw[1]=ha1a1|ha1b1|ha2a1|ha2b1|ha3a1|ha3b1|ha4a1|ha4b1|ha5a1
dw[0]=ha1a0|ha1b0|ha2a0|ha2b0|ha3a0|ha3b0|ha4a0|ha4b0|ha5a0

2.1.3 Segment Decoder "A" 604

Figure 9:
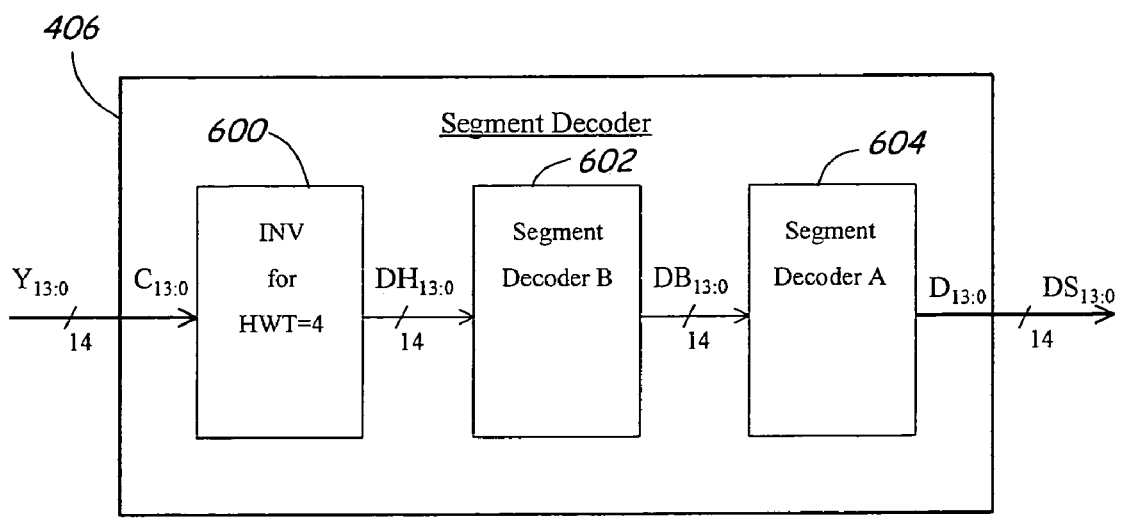
FIG. 9 is a block diagram of a segment decoder employed within the decoders shown in FIGS. 4 and 5, according to one embodiment of the present invention.
Figure 11:
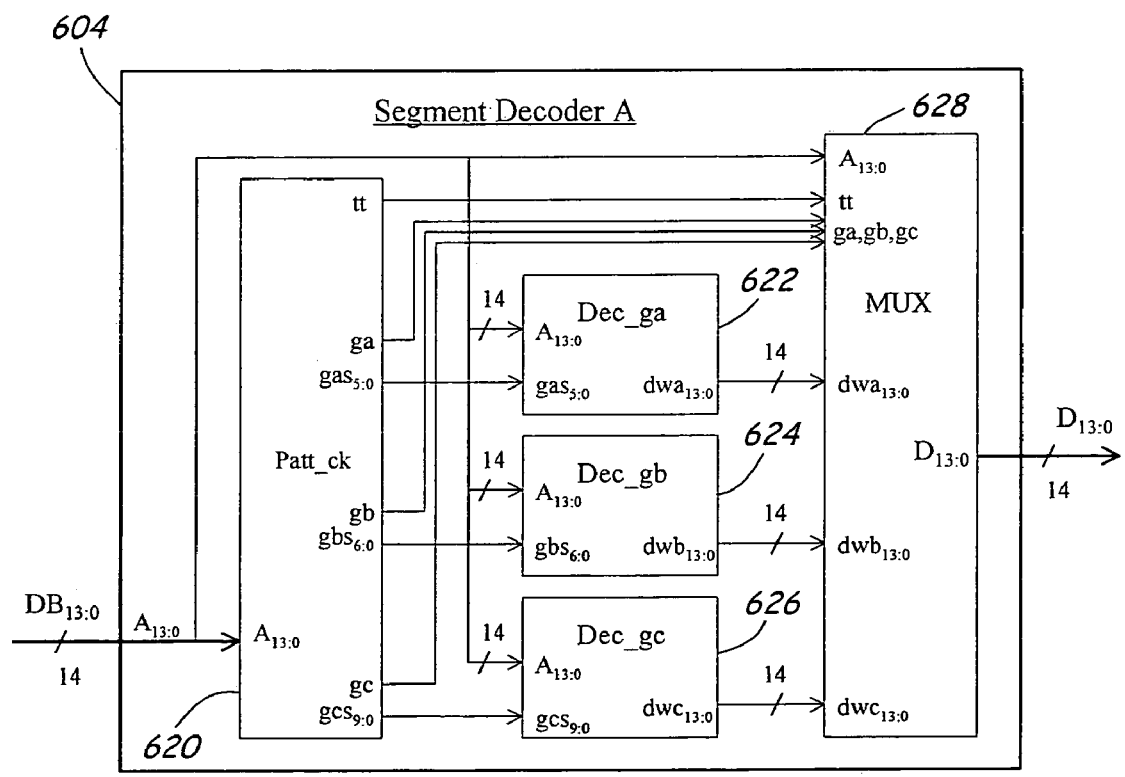
FIG. 11 is a block diagram, which illustrates a segment decoder "A" within the segment decoder shown in FIG. 9.

Referring back to FIG. 9, segment decoder "A" 604 decodes the data segment $DB_{13:0}$ decoded by segment decoder "B" 602 to produce data segment $DS_{13:0}$ using the inverse of the coding rules applied by segment encoder "A" 450 shown in FIGS. 6 and 7, which enforced the desired RDS constraint. FIG. 11 is a block diagram, which illustrates segment decoder "A" 604 in greater detail.

Segment decoder "A" includes the following inputs and outputs.

Input:
A13,A12,A11,A10,A9,A8,A7,A6,A5,A4,A3,A2,A1,A0 (14-bit Word)

Output:
D13,D12,D11,D10,D9,D8,D7,D6,D5,D4,D3,D2,D1,D0 (14-bit Word)

Segment decoder "A" includes pattern check circuit 620, group "a" decoder 622, group "b" decoder 624, group "c" decoder 626 and multiplexer 628.

2.1.3.1 Pattern Check Circuit 620

Pattern check circuit 620 receives the data segments $DB_{13:0}$ from segment decoder "B" and checks its bit pattern to identify the group in which the pattern belongs. If the pattern corresponds to an original data segment that satisfied the RDS constraints without encoding, pattern check circuit 620 sets flag "tt", and multiplexer 628 routes input $A_{13:0}$ directly to multiplexer output $D_{13:0}$ without decoding. If not, pattern check circuit 620 identifies whether the incoming bit pattern corresponds to group "a", group "b" or group "c" and sets the corresponding flag, ga, gb or gc. Pattern check circuit 620 also identifies the subgroup in which the incoming pattern belongs through outputs $gas_{5:0}$, $gbs_{6:0}$ and $gcs_{9:0}$. Group "a" has six subgroups, group "b" has seven subgroups and group "c" has ten subgroups.

The following logical equations describe the function performed by pattern check circuit 620:

Input:
A13,A12,A11,A10,A9,A8,A7,A6,A5,A4,A3,A2,A1,A0 (14-bit Word)

Output:
$gas_{5:0}$, $gbs_{6:0}$, $gcs_{9:0}$, ga, gb, gc, tt

| | |
|---|---|
| wa3= A13&A12 | wa2= A13&!A12 |
| wa1=!A13&A12 | wa0=!A13&!A12 |
| wbF= A11& A10& A9& A8 | wbE= A11& A10& A9&!A8 |
| wbD= A11& A10&!A9& A8 | wbC= A11& A10&!A9&!A8 |
| wbB= A11&!A10& A9& A8 | wbA= A11&!A10& A9&!A8 |
| wb9= A11&!A10&!A9& A8 | wb8= A11&!A10&!A9&!A8 |

-continued

| | |
|---|---|
| wb7=!A11& A10& A9& A8 | wb6=!A11& A10& A9&!A8 |
| wb5=!A11& A10&!A9& A8 | wb4=!A11& A10&!A9&!A8 |
| wb3=!A11&!A10& A9& A8 | wb2=!A11&!A10& A9&!A8 |
| wb1=!A11&!A10&!A9& A8 | wb0=!A11&!A10&!A9&!A8 |
| wcF= A7& A6& A5& A4 | wcE= A7& A6& A5&!A4 |
| wcD= A7& A6&!A5& A4 | wcC= A7& A6&!A5&!A4 |
| wcB= A7&!A6& A5& A4 | wcA= A7&!A6& A5&!A4 |
| wc9= A7&!A6&!A5& A4 | wc8= A7&!A6&!A5&!A4 |
| wc7=!A7& A6& A5& A4 | wc6=!A7& A6& A5&!A4 |
| wc5=!A7& A6&!A5& A4 | wc4=!A7& A6&!A5&!A4 |
| wc3=!A7&!A6& A5& A4 | wc2=!A7&!A6& A5&!A4 |
| wc1=!A7&!A6&!A5& A4 | wc0=!A7&!A6&!A5&!A4 |
| wdF= A3& A2& A1& A0 | wdE= A3& A2& A1&!A0 |
| wdD= A3& A2&!A1& A0 | wdC= A3& A2&!A1&!A0 |
| wdB= A3&!A2& A1& A0 | wdA= A3&!A2& A1&!A0 |
| wd9= A3&!A2&!A1& A0 | wd8= A3&!A2&!A1&!A0 |
| wd7=!A3& A2& A1& A0 | wd6=!A3& A2& A1&!A0 |
| wd5=!A3& A2&!A1& A0 | wd4=!A3& A2&!A1&!A0 |
| wd3=!A3&!A2& A1& A0 | wd2=!A3&!A2& A1&!A0 |
| wd1=!A3&!A2&!A1& A0 | wd0=!A3&!A2&!A1&!A0 | pb12r=wb1|wb2
pb02r=wb0|wb1|wb2
pb03r=pb02r|wb3
pb56r=wb5|wb6
pc18r=wc1|wc2|wc4|wc8
pc08r=wc0|pc18r
pc7er=wc7|wcB|wcD|wcE
pc7fr=pc7er|wcF
pc3cr=wc3|wc5|wc6|wc9|wcA|wcC
pd7er=wd7|wdB|wdD|wdE
pd7fr=pd7er|wdF
pd18r=wd1|wd2|wd4|wd8
pd08r=pd18r|wd0
pd3cr=wd3|wd5|wd6|wd9|wdA|wdC
tt=A13|A12|A11
gas[0]=(pb03r)&wdF&!(wb3&wcF&wdF)&!((pb12r)&wc0&wdF)
gas[1]=(pb02r)&!(pc08r)&(pd7er)
gas[2]=(wb3)&!(pc08r)&(pd18r)
gas[3]=(wb0|wb3)&(pc7fr)&(pd3cr)
gas[4]=(pb12r|wb4)&(pc7fr)&(pd18r)
gas[5]=(wb1&(wc1|wc2|wc4)&(pd7er))|(wb0&wcF&(pd18r))
ga=(gas[0]|gas[1]|gas[2]|gas[3]|gas[4]|gas[5])&!tt
gbs[0]=(pb12r)&!(pc08r)&(pd3cr)
gbs[1]=(wb4)&!(pc08r)&(pd3cr)
gbs[2]=(wb4)&(A6|A7)&(pd7fr)
gbs[3]=((pb56r)|(wb7&!(A6|A7)))&(pd7fr)
gbs[4]=(pb56r)&(A6|A7)&(wd5|wd6|wd9|wdA|wdC)
gbs[5]=((wb3&!(pc7fr))|(wb7&(wc0|wc1)))&(pd3cr)
gbs[6]=(pb56r)&(wc1|wc2|wc3)&(pd3cr)
gb=(gbs[0]|gbs[1]|gbs[2]|gbs[3]|gbs[4]|gbs[5]|gbs[6])&!tt
gcs[0]=(wb7)&(wc3|wc5|wc6|pc7er)&(pd08r)
gcs[7]=(((pb56r)&(pc7fr))|(wb7&(wcC|wcF)))&(pd08r)
gcs[2]=((wb3&wcF)|(wb4&(wc1|wc2|wc3))|(wb7&(wcC|wcD|wcE)))&(pd7fr)
gcs[3]=(wb7)&(A6^7)&(pd7fr)
gcs[4]=(wb7&(pc18r)&(pd18r))|(wb6&(A6|A7)&wd3)
gcs[5]=(pb56r)&(pc3cr)&(pd18r)
gcs[6]=(wb3)&(wc0|(A6^7))&(pd7er)
gcs[7]=(wb3)&(wc1|wc2|wc3|wcC|wcD|wcE)&(pd7er)
gcs[8]=wb7&(((pc3cr)&(wd9|wdA))|((wcB|wcD|wcE)&(wd3|wdC))|(wc7&wdC))
gcs[9]=wb7&(((pc7er)&(wd5|wd6))|((pc3cr)&wdC)|(wcF&wd3))
gc=(gcs[0]|gcs[1]|gcs[2]|gcs[3]|gcs[4]|gcs[5]|gcs[6]|gcs[7]|gcs[8]|gcs[9])&!tt 2.1.3.2 Group "a" Decoder 622

Group "a" decoder 622 decodes input $A_{13:0}$ according to which of the six subgroups is identified by $gas_{5:0}$ to produce decoded word segment $dwa_{13:0}$. The following logical equations describe the function performed by group "a" decoder 622:

Input:
A13,A12,A11,A10,A9,A8,A7,A6,A5,A4,A3,A2,A1,A0 (14-bit Word)

$gas_{5:0}$

Output:
$dwa_{13:0}$ (14-bit Word)
ga0a=gas[0]
ga0a13=ga0a & A9
ga0a12=ga0a & A8
ga0a11=ga0a &(A9 ^ !A8)
ga0a10=ga0a &(A9 & A8)
ga0a9=ga0a &(A9 & A8)
ga0a8=ga0a &(A9 & A8)
ga0a7=ga0a & !A7
ga0a6=ga0a &!A6
ga0a5=ga0a &!A5
ga0a4=ga0a &!A4
ga0a3=ga0a &(A9 & A8)
ga0a2=ga0a &(A9 & A8)
ga0a1=ga0a &(A9 & A8)
ga0a0=ga0a &(A9 & A8)
ga1a=gas[1]
ga1a13=ga1a & A9
ga1a12=ga1a& A8
ga1a11=ga1a &(!A9 &!A8)
ga1a10=0
ga1a9=0
ga1a8=0
ga1a7=ga1a &!A7
ga1a6=ga1a &!A6
ga1a5=ga1a &!A5
ga1a4=ga1a &!A4
ga1a3=ga1a &!A3
ga1a2=ga1a &!A2
ga1a1=ga1a &!A1
ga1a0=ga1a &!A0
ga1b=gas[2]
ga1b13=ga1b
ga1b12=ga1b
ga1b11=ga1b
ga1b10=ga1b
ga1b9=ga1b
ga1b8=ga1b
ga1b7=ga1b & A7
ga1b6=ga1b & A6
ga1b5=ga1b & A5
ga1b4=ga1b & A4
ga1b3=ga1b &!A3
ga1b2=ga1b &!A2
ga1b1=ga1b &!A1
ga1b0=ga1b &!A0
ga2a=gas[3]
ga2a13=ga2a & A9
ga2a12=ga2a & A9
ga2a11=ga2a
ga2a10=ga2a & A9
ga2a9=ga2a & A9
ga2a8=ga2a & A9
ga2a7=ga2a &(A9 ^ !A7)
ga2a6=ga2a &(A9 ^ !A6)
ga2a5=ga2a &(A9 ^ !A5)
ga2a4=ga2a &(A9 ^ !A4)
ga2a3=ga2a &(A9 ^ !A3)

ga2a2=ga2a &(A9 ^ !A2)
ga2a1=ga2a &(A9 ^ !A1)
ga2a0=ga2a &(A9 ^ !A0)
ga2b=gas[4]
ga2b13=ga2b&(A3 | A2)
ga2b12=ga2b &(A1 | A0)
ga2b11=0
ga2b10=0
ga2b9=0
ga2b8=0
ga2b7=ga2b &!A7
ga2b6=ga2b &!A6
ga2b5=ga2b & !A5
ga2b4=ga2b &!A4
ga2b3=ga2b &(A3 | A1)
ga2b2=ga2b&(!A8 & (A10 |(!A3 & A1)))
ga2b1=ga2b&((!A9 & (A13 ^ A2)) | (!A2 & (A9 ^ A0)))
ga2b0=ga2b&(!A10 & (!A9 |(!A3 & !A1)))
ga3a=gas[5]
ga3a13=ga3a & A6
ga3a12=ga3a & A5
ga3a11=ga3a & A4
ga3a10=ga3a & !A8
ga3a9=ga3a & !A8
ga3a8=ga3a & !A8
ga3a7=ga3a & !A8
ga3a6=ga3a & !A8
ga3a5=ga3a & !A8
ga3a4=ga3a & !A8
ga3a3=ga3a & A3
ga3a2=ga3a & A2
ga3a1=ga3a & A1
ga3a0=ga3a & A0
dwa[13]=ga0a13|ga1a13|ga1b13|ga2a13|ga2b13|ga3a13
dwa[12]=ga0a12|ga1a12|ga1b12|ga2a12|ga2b12|ga3a12
dwa[11]=ga0a11|ga1a11|ga1b11|ga2a11|ga2b11|ga3a11
dwa[10]=ga0a10|ga1a10|ga1b10|ga2a10|ga2b10|ga3a10
dwa[9]=ga0a9|ga1a9|ga1b9|ga2a9|ga2b9|ga3a9
dwa[8]=ga0a8|ga1a8|ga1b8|ga2a8|ga2b8|ga3a8
dwa[7]=ga0a7|ga1a7|ga1b7|ga2a7|ga2b7|ga3a7
dwa[6]=ga0a6|ga1a6|ga1b6|ga2a6|ga2b6|ga3a6
dwa[5]=ga0a5|ga1a5|ga1b5|ga2a5|ga2b5|ga3a5
dwa[4]=ga0a4|ga1a4|ga1b4|ga2a4|ga2b4|ga3a4
dwa[3]=ga0a3|ga1a3|ga1b3|ga2a3|ga2b3|ga3a3
dwa[2]=ga0a2|ga1a2|ga1b2|ga2a2|ga2b2|ga3a2
dwa[1]=ga0a1|ga1a1|ga1b1|ga2a1|ga2b1|ga3a1
dwa[0]=ga0a0|ga1a0|ga1b0|ga2a0|ga2b0|ga3a0

2.1.3.3 Group "b" Decoder 624

Similarly, group "b" decoder 624 decodes input $A_{13:0}$ according to which subgroup is identified by $gbs_{6:0}$ to produce decoded word segment $dwb_{13:0}$. The following logical equations define the function performed by group "b" decoder 624:

Input:
  A13,A12,A11,A10,A9,A8,A7,A6,A5,A4,A3,A2,A1,A0
    (14-bit Word)
  $gbs_{6:0}$ Output:
  $dwb_{13:0}$ (14-bit Word)
  gb1a=gbs[0]
  gb1a13=gb1a&(A9 &(!A3 | !A0))
  gb1a12=gb1a&((!A9 & (A13 ^!A3)) | (!A1 & (A9 ^!A3)))
  gb1a11=gb1a&(A3 &(!A9 | !A2))
  gb1a10=gb1a&(A2 & (!A0 &(!A9 | !A3)))
  gb1a9=gb1a&((!A9 &(A3^!A1)) | (!A3 & (A13 ^!A1)))
  gb1a8=gb1a&(A0 & (!A2 &(!A9 | !A3)))
  gb1a7=gb1a &!A7
  gb1a6=gb1a &!A6
  gb1a5=gb1a & !A5
  gb1a4=gb1a &!A4
  gb1a3=0
  gb1a2=0
  gb1a1=0
  gb1a0=0
  gb1b=gbs[1]
  gb1b13=gb1b&(A3 | A2)
  gb1b12=gb1b &(A3 | A1)
  gb1b11=gb1b &(A3 | A0)
  gb1b10=gb1b&(!A3 | !A0)
  gb1b9=gb1b&(!A3 | !A1)
  gb1b8=gb1b &(!A3 | !A2)
  gb1b7=gb1b & A7
  gb1b6=gb1b & A6
  gb1b5=gb1b & A5
  gb1b4=gb1b & A4
  gb1b3=gb1b
  gb1b2=gb1b
  gb1b1=gb1b
  gb1b0=gb1b
  gb2a=gbs[2]
  gb2a13=0
  gb2a12=0
  gb2a11=gb2a
  gb2a10=gb2a &(A7 & A6)
  gb2a9=gb2a &!A6
  gb2a8=gb2a &!A7
  gb2a7=gb2a &!A3
  gb2a6=gb2a &!A2
  gb2a5=gb2a &!A1
  gb2a4=gb2a &!A0
  gb2a3=gb2a &(A5 & A4)
  gb2a2=gb2a &(A5 &!A4)
  gb2a1=gb2a &(A4 &!A5)
  gb2a0=gb2a &(!A5 &!A4)
  gb2b=gbs[3]
  gb2b13=gb2b & A9
  gb2b12=gb2b & A8
  gb2b11=gb2b &(A7 & A6)
  gb2b10=gb2b &(A7 &!A6)
  gb2b9=gb2b &(A6 &!A7)
  gb2b8=gb2b&(!A7 & (!A6 &(!A9 | !A8)))
  gb2b7=gb2b &!A3
  gb2b6=gb2b &!A2
  gb2b5=gb2b &!A1
  gb2b4=gb2b &!A0
  gb2b3=gb2b &(A5 & A4)
  gb2b2=gb2b &(A5 &!A4)
  gb2b1=gb2b &(A4 &!A5)
  gb2b0=gb2b &(!A5 &!A4)
  gb2c=gbs[4]
  gb2c13=gb2c &(A9 | A7)
  gb2c12=gb2c &(A9 | A6)
  gb2c11=gb2c &(A9 | !A7 | !A6)
  gb2c10=gb2c &(A8 | A7)
  gb2c9=gb2c &(A8 | A6)
  gb2c8=gb2c &(!A9 | !A7 | !A6)
  gb2c7=gb2c &(A3 | A1)
  gb2c6=gb2c &(A3 | !A1)
  gb2c5=gb2c &(!A3 | !A0)
  gb2c4=gb2c &(!A3 | !A1)
  gb2c3=gb2c &(!A5 | !A4)
  gb2c2=gb2c &(A4 | !A5)
  gb2c1=gb2c &(A5 | !A4)
  gb2c0=gb2c &(A5 | A4)
  gb3a=gbs[5]
  gb3a13=gb3a&(!A10 & (A7 |(!A6 & !A4)))
  gb3a12=gb3a&(!A10 & (A6 |(!A7 & !A5)))
  gb3a11=gb3a &(A7 & !A6)
  gb3a10=gb3a&(A5 & ((A13 ^ A7) | (A6 ^ A4)))

gb3a9=gb3a&(A4 & ((A13 ^ A10) | (A7 ^ A6)))
gb3a8=gb3a&(!A5 & (!A4 &(!A7 | !A6)))
gb3a7=0
gb3a6=0
gb3a5=0
gb3a4=0
gb3a3=gb3a & A3
gb3a2=gb3a & A2
gb3a1=gb3a & A1
gb3a0=gb3a & A0
gb3b=gbs[6]
gb3b13=gb3b &(A9 | A5)
gb3b12=gb3b &(A9 | A4)
gb3b11=gb3b&(A9 !A5 | !A4)
gb3b10=gb3b &(A8 A5)
gb3b9=gb3b &(A8 | A4)
gb3b8=gb3b&(!A9 | !A5 | !A4)
gb3b7=gb3b
gb3b6=gb3b
gb3b5=gb3b
gb3b4=gb3b
gb3b3=gb3b & A3
gb3b2=gb3b& A2
gb3b1=gb3b & A1
gb3b0=gb3b & A0
dwb[13]
 =gb1a13|gb1b13|gb2a13|gb2b13|gb2c13|gb3a13|gb3b13
dwb[12]
 =gb1a12|gb1b12|gb2a12|gb2b12|gb2c12|gb3a12|gb3b12
dwb[11]
 =gb1a11|gb1b11|gb2a11|gb2b11|gb2c11|gb3a11|gb3b11
dwb[10]
 =gb1a10|gb1b10|gb2a10|gb2b10|gb2c10|gb3a10|gb3b10
dwb[9]=gb1a9|gb1b9|gb2a9|gb2b9|gb2c9|gb3a9|gb3b9
dwb[8]=gb1a8|gb1b8|gb2a8|gb2b8|gb2c8|gb3a8|gb3b8
dwb[7]=gb1a7|gb1b7|gb2a7|gb2b7|gb2c7|gb3a7|gb3b7
dwb[6]=gb1a6|gb1b6|gb2a6|gb2b6|gb2c6|gb3a6|gb3b6
dwb[5]=gb1a5|gb1b5|gb2a5|gb2b5|gb2c5|gb3a5|gb3b5
dwb[4]=gb1a4|gb1b4|gb2a4|gb2b4|gb2c4|gb3a4|gb3b4
dwb[3]=gb1a3|gb1b3|gb2a3|gb2b3|gb2c3|gb3a3|gb3b3
dwb[2]=gb1a2|gb1b2|gb2a2|gb2b2|gb2c2|gb3a2|gb3b2
dwb[1]=gb1a1|gb1b1|gb2a1|gb2b1|gb2c1|gb3a1|gb3b1
dwb[0]=gb1a0|gb1b0|gb2a0|gb2b0|gb2c0|gb3a0|gb3b0

2.1.3.4 Group "c" Decoder 626

Group "c" decoder 626 decodes input $A_{13:0}$ according to which subgroup is identified by $gcs_{9:0}$ to produce decoded word segment $dwc_{13:0}$. The following logical equations define the function performed by group "c" decoder 626:

Input:
    A13,A12,A11,A10,A9,A8,A7,A6,A5,A4,A3,A2,A1,A0
    (14-bit Word)
    $gcs_{9:0}$
Output:
    $dwc_{13:0}$ (14-bit Word)
gc1a=gcs[0]
gc1a13=gc1a & !A7
gc1a12=gc1a & !A7
gc1a11=gc1a&((!A13 & (A13 ^ A7)) | (A6 & (A5^!A4)))
gc1a10=gc1a&(!A4 |(A7 & A6))
gc1a9=gc1a &(A7 ^ !A5)
gc1a8=gc1a&(!A6 |(A7 & !A5))
gc1a7=gc1a & A3
gc1a6=gc1a & A2
gc1a5=gc1a & A1
gc1a4=gc1a & A0
gc1a3=0
gc1a2=0
gc1a1=0
gc1a0=0
gc1b=gcs[1]
gc1b13=gc1b&(!A8 |(A9 & A5))
gc1b12=gc1b&(!A9 |(A8 &!A5))
gc1b11=gc1b&(A7 & (A6 &(A5 !A4)))
gc1b10=gc1b&(!A6 (!A5 |(A9 & A8)))
gc1b9=gc1b&(A6 & (A4 &(!A9 | !A8)))
gc1b8=gc1b&(!A7 |(!A6 |(A5 & !A4)))
gc1b7=gc1b & A3
gc1b6=gc1b & A2
gc1b5=gc1b & A1
gc1b4=gc1b & A0
gc1b3=0
gc1b2=0
gc1b1=0
gc1b0=0
gc1c=gcs[2]
gc1c13=gc1c & A10
gc1c12=gc1c & A10
gc1c11=gc1c &(!A10 | !A9)
gc1c10=gc1c&((A9 & (A13 ^ A5)) | (A4 & (A9 ^ A5)))
gc1c9=gc1c &(!A10 | !A4)
gc1c8=gc1c &(!A10 | !A5)
gc1c7=gc1c & A3
gc1c6=gc1c & A2
gc1c5=gc1c & A1
gc1c4=gc1c & A0
gc1c3=gc1c
gc1c2=gc1c
gc1c1=gc1c
gc1c0=gc1c
gc1d=gcs[3]
gc1d13=gc1d & A7
gc1d12=gc1d &!A7
gc1d11=gc1d &(A5 | A4)
gc1d10=gc1d&(A5 | !A4)
gc1d9=gc1d &(A4 | !A5)
gc1d8=gc1d &(!A5 | !A4)
gc1d7=gc1d & A3
gc1d6=gc1d & A2
gc1d5=gc1d & A1
gc1d4=gc1d & A0
gc1d3=gc1d
gc1d2=gc1d
gc1d1=gc1d
gc1d0=gc1d
gc2a=gcs[4]
gc2a13=gc2a & A8
gc2a12=gc2a & A8
gc2a11=gc2a &(A7 | !A8)
gc2a10=gc2a &((A8 & A6)|(!A8 & A7))
gc2a9=gc2a &((A8 & A5)|(!A8 & A6))
gc2a8=gc2a&((!A8 & (A7 ^ A6)) (A8 & (A13 ^ A4)))
gc2a7=0
gc2a6=0
gc2a5=0
gc2a4=0
gc2a3=gc2a&(A3 |(A5 & A4))
gc2a2=gc2a&((!A13 & (A13 ^ A2)) | (A5 & (A8 ^!A4)))
gc2a1=gc2a&(A1 & (A8 |(A4 & !A5)))
gc2a0=gc2a&(A0 & (A8 |(!A5 & !A4)))
gc2b=gcs[5]
gc2b13=gc2b & A9
gc2b12=gc2b &!A9
gc2b11=gc2b & A7
gc2b10=gc2b & A6
gc2b9=gc2b & A5
gc2b8=gc2b & A4
gc2b7=0
gc2b6=0
gc2b5=0 gc2b4=0
gc2b3=gc2b & A3
gc2b2=gc2b & A2
gc2b1=gc2b & A1
gc2b0=gc2b & A0
gc2c=gcs[6]
gc2c13=gc2c & A7
gc2c12=gc2c & A6
gc2c11=gc2c&(A5 (A4 |(!A7 & A6)))
gc2c10=gc2c &(A5 | !A4)
gc2c9=gc2c &(A4 | !A5)
gc2c8=gc2c &(!A5 | !A4)
gc2c7=gc2c
gc2c6=gc2c
gc2c5=gc2c
gc2c4=gc2c
gc2c3=gc2c & A3
gc2c2=gc2c & A2
gc2c1=gc2c & A1
gc2c0=gc2c & A0
gc2d=gcs[7]
gc2d13=gc2d
gc2d12=gc2d
gc2d11=gc2d & A7
gc2d10=gc2d & A5
gc2d9=gc2d & A4
gc2d8=gc2d&((!A7 & (A9 ^ A5)) | (!A4 & (A7 ^ A5)))
gc2d7=gc2d
gc2d6=gc2d
gc2d5=gc2d
gc2d4=gc2d
gc2d3=gc2d & A3
gc2d2=gc2d & A2
gc2d1=gc2d & A1
gc2d0=gc2d & A0
gc3a=gcs[8]
gc3a13=gc3a & !A0
gc3a12=gc3a & !A1
gc3a11=gc3a &(A7 ^ A2)
gc3a10=gc3a &(A6 ^ A2)
gc3a9=gc3a &(A5 ^ A2)
gc3a8=gc3a &(A4 ^ A2)
gc3a7=gc3a
gc3a6=gc3a
gc3a5=gc3a
gc3a4=gc3a
gc3a3=gc3a
gc3a2=gc3a
gc3a1=gc3a
gc3a0=gc3a
gc3b=gcs[9]
gc3b13=gc3b & !A0
gc3b12=gc3b & !A1
gc3b11=gc3b & A7
gc3b10=gc3b & A6
gc3b9=gc3b & A5
gc3b8=gc3b & A4
gc3b7=0
gc3b6=0
gc3b5=0
gc3b4=0
gc3b3=0
gc3b2=0
gc3b1=0
gc3b0=0
dwc[13]=gc1a13|gc1b13|gc1c13|gc1d13|gc2a13|gc2b13|
    gc2c13| gc2d13|gc3a13|gc3b13
dwc[12]=gc1a12|gc1b12|gc1c12|gc1d12|gc2a12|gc2b12|
    gc2c12|gc2d12|gc3a12|gc3b12
dwc[11]=gc1a11|gc1b11|gc1c11|gc1d11|gc2a11|gc2b11|
    gc2c11|gc2d11|gc3a11|gc3b11
dwc[10]=gc1a10|gc1b10|gc1c10|gc1d10|gc2a10|gc2b10|
    gc2c10|gc2d10|gc3a10|gc3b10
dwc[9]=gc1a9|gc1b9|gc1c9|gc1d9|gc2a9|gc2b9|gc2c9|
    gc2d9|gc3a9|gc3b9
dwc[8]=gc1a8|gc1b8|gc1c8|gc1d8|gc2a8|gc2b8|gc2c8|
    gc2d8|gc3a8|gc3b8
dwc[7]=gc1a7|gc1b7|gc1c7|gc1d7|gc2a7|gc2b7|gc2c7|
    gc2d7|gc3a7|gc3b7
dwc[6]=gc1a6|gc1b6|gc1c6|gc1d6|gc2a6|gc2b6|gc2c6|
    gc2d6|gc3a6|gc3b6
dwc[5]=gc1a5|gc1b5|gc1c5|gc1d5|gc2a5|gc2b5|gc2c5|
    gc2d5|gc3a5|gc3b5
dwc[4]=gc1a4|gc1b4|gc1c4|gc1d4|gc2a4|gc2b4|gc2c4|
    gc2d4|gc3a4|gc3b4
dwc[3]=gc1a3|gc1b3|gc1c3|gc1d3|gc2a3|gc2b3|gc2c3|
    gc2d3| gc3a3|gc3b3
dwc[2]=gc1a2|gc1b2|gc1c2|gc1d2|gc2a2|gc2b2|gc2c2|
    gc2d2|gc3a2|gc3b2
dwc[1]=gc1a1|gc1b1|gc1c1|gc1d1|gc2a1|gc2b1|gc2c1|
    gc2d1|gc3a1|gc3b1
dwc[0]=gc1a0|gc1b0|gc1c0|gc1d0|gc2a0|gc2b0|gc2c0|
    gc2d0|gc3a0|gc3b0

2.1.3.5 Multiplexer 628

Multiplexer 628 routes either $A_{13:0}$, $dwa_{13:0}$, $dwb_{13:0}$, or $dwc_{13:0}$ to multiplexer output $D_{13:0}$ depending on the values of select inputs tt, ga, gb and gc. The following logical equations define the function performed by multiplexer 628:

Input: $A_{13:0}$, $dwa_{13:0}$, $dwb_{13:0}$, $dwc_{13:0}$, tt, ga, gb, gc

Output: $D_{13:0}$

If (tt) $D_{13:0}=A_{13:0}$
If (ga) $D_{13:0}=dwa_{13:0}$
If (gb) $D_{13:0}=dwb_{13:0}$
If (gc) $D_{13:0}=dwc_{13:0}$ 2.2 Output Mapping from Segment Decoders 406

Referring back to FIG. 4, the decoded outputs from segment decoders 406-1 through 406-5 produce the corresponding 14-bit data segments $DS_a$–$DS_e$, respectively. The most significant three bits, $DSa_{13:11}$, $DSb_{13:11}$, $DSc_{13:11}$, $DSd_{13:11}$, $DSe_{13:11}$, of each data segment are inverted to recover mapped segments $W_{2:0}$, $W_{5:3}$, $W_{8:6}$, $W_{11:9}$ and $W_{14:12}$. Passthrough segments 414 are passed straight through without change and form bits $I_{68:14}$ of the recovered user data word on output 404. This mapping is summarized as follows:

$W_{2:0}$=!$DSa_{13:11}$  $I_{24:14}$=$DSa_{10:0}$
$W_{5:3}$=!$DSb_{13:11}$  $I_{35:25}$=$DSb_{10:0}$
$W_{8:6}$=!$DSc_{13:11}$  $I_{46:36}$=$DSc_{10:0}$
$W_{11:9}$=!$DSd_{13:11}$  $I_{57:47}$=$DSd_{10:0}$
$W_{14:12}$=!$DSe_{13:11}$  $I_{68:58}$=$DSe_{10:0}$

The mapped segments $W_{2:0}$, $W_{5:3}$, $W_{8:6}$, $W_{11:9}$ and $W_{14:12}$ are applied to the 15-bit to 14-bit decoder 408 as $W_{14:0}$.

2.3 15-bit to 14-bit Decoder 408

Decoder 408 applies the inverse of the coding rules applied by 14-bit to 15-bit mapping block 202 shown in FIG. 2. The resulting decoded segment $I_{13:0}$ (416) is concatenated with the segments forming $I_{68:14}$ to form the original recovered user data word $I_{68:0}$.

The following logical equations define the function performed by decoder 408 according to one embodiment of the present invention:

Input:
W14,W13,W12,W11,W10,W9,W8,W7,W6,W5,W4,W3,W2,W1,W0
(15-bit Code word)

Output:
I13,I12,I11,I10,I9,I8,I7,I6,I5,I4,I3,I2,I1,I0
(14-bit Data word)
HH=!W14
JK=W14
JJ=(!W11|(!W10&!W9))&JK
KK=!JJ&JK
H0=(!W11&!W10&!W9&JJ)|
   (!W13&!W12&W11&!W10&W9&KK)
H1=(!W11&!W10&                 W9&JJ)|
   (!W13&!W12&W11&W10&!W9&KK)
H2=(!W11&W10&!W9&JJ)|(!W13&
   W12&W11&!W10&W9&KK)
H3=(!W11&       W10&       W9&JJ)|(!W13&
   W12&W11&W10&!W9&KK)
T2=(W11&!W10&!W9&JJ)|
   (W13&!W12&W11&!W10&W9&KK)
H01=W8&!W7&!W6&T2
H02=!W8&!W7&W6&T2
H03=!W8&W7&!W6&T2
H12=!W8&W7&W6&T2
H13=W8&!W7&!W6&T2
H23=W8&!W7&W6&T2
T3=W8&W7&!W6&T2
H012=!W5&W4&W3&T3
H013=!W5&W4&!W3&T3
H023=!W5&!W4&W3&T3
H123=!W5&!W4&!W3&T3
H0123=W5&!W4&!W3&T3
J9c6=(H0|H1|H2)
J9c3=(H01|H02|H12)
J9c0=H012
J9ca=(H3|H03|H13|H23|H123|H023|H013|H0123)
J6c6=H3
J6c3=(H0|H1|H03|H13)
J6c0=(H01|H013)
J6ca=(H2|H02|H12|H23|H123|H023|H012|H0123)
J3c3=(H2|H3|H23)
J3c0=(H0|H02|H03|H023)
J3ca=(H1|H01|H12|H13|H123|H013|H012|H0123)
J0c0=(H1|H2|H3|H12|H13|H23|H123)
J0ca=(H0|H01|H02|H03|H023|H013|H012|H0123)
J11=(W8 &J9c6)|(W5 &J9c3)|(W2 &J9c0)|J9ca
J10=(W7 &J9c6)|(W4 &J9c3)|(W1 &J9c0)|J9ca
J9=(W6 &J9c6)|(W3 &J9c3)|(W0 &J9c0)|J9ca
J8=(W8 &j6c6)|(W5 &J6c3)|(W2 &J6c0)|J6ca
J7=(W7 &J6c6)|(W4 &J6c3)|(W1 &J6c0)|J6ca
J6=(W6 &J6c6)|(W3 &J6c3)|(W0 &J6c0)|J6ca
J5=(W5 &J3c3)|(W2&J3c0)|J3ca
J4=(W4 &J3c3)|(W1&J3c0)|J3ca
J3=(W3 &J3c3)|(W0&J3c0)|J3ca
J2=(W2 &J0c0)|J0ca
J1=(W1 &J0c0)|J0ca
J0=(W0 &J0c0)|J0ca
I13=(W13&(HH|JJ))|(KK)
I12=(W12&(HH|JJ))|(KK)
I11=(W11&HH)|(J11&JK)
I10=(W10&HH)|(J10&JK)
I9=(W9 &HH)|(J9 &JK)
I8=(W8 &HH)|(J8 &JK)
I7=(W7 &HH)|(J7 &JK)
I6=(W6 &HH)|(J6 &JK)
I5=(W5 &HH)|(J5 &JK)
I4=(W4 &HH)|(J4 &JK)
I3=(W3 &HH)|(J3 &JK)
I2=(W2 &HH)|(J2 &JK)
I1=(W1 &HH)|(J1 &JK)
I0=(W0 &HH)|(J0 &JK)

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the communication system while maintaining substantially the same functionality without departing from the scope and spirit of the present invention. In addition, it will be appreciated by those skilled in the art that the teachings of the present invention can be applied to any communication channel in which DC-limited codes are useful, such as in data storage devices, satellite communications, telecommunications, and wire-based communications without departing from the scope and spirit of the present invention. Also, a digital "word", "block" or "segment" can have any number of bits, and the division of bits between segments and the number of segments can vary in alternative embodiments of the present invention. In addition, computing the RDS of a given data word is considered equivalent to computing the RDS of the corresponding code word when the comparison is made to the running RDS of the code word sequence. The RDS of the code word is a function of the RDS of the data word and a similar effect is achieved. The block diagrams shown in the attached figures are intended as examples only and can be modified in alternative embodiments.

What is claimed is:

1. A method of encoding successive user data words into respective code words, the method comprising:
   (a) mapping each data word into data segments that are constrained to a first number of bit patterns, which is less than a second number of bit patterns that satisfy a first constraint;
   (b) encoding the data segments into intermediate code word segments selected from a first set of the bit patterns that satisfy the first constraint, wherein at least some of the bit patterns in the first set violate a second constraint; and
   (c) encoding the intermediate code word segments into respective code word segments by encoding the intermediate code word segments that violate the second constraint with code word segments selected from a second, different set of the bit patterns that satisfy the first constraint and the second constraint.

2. The method of claim 1 wherein (a) comprises:
   (a) (1) dividing the data word into a mapping segment and a number of passthrough segments, the number of passthrough segments equaling the number of data segments;
   (a)(2) mapping the mapping segment into a number of constrained mapped segments, the number of mapped segments equaling the number of data segments; and
   (a)(3) combining each mapped segment with one of the passthrough segments to form one of the data segments.

3. The method of claim 2 wherein (a) (2) comprises constraining the mapped segments such that the data segments are limited to the first number of bit patterns.

4. The method of claim 1 wherein the first constraint limits the bit patterns in the first and second sets to patterns having a running digital sum of −4, −2, 0, 2, 4 or 6 only.

5. The method of claim 1 and further comprising:
   (d) combining the code word segments to form a respective code word.

6. The method of claim 5 wherein the second constraint comprises a "k" constraint that limits a distance between transitions in the bit patterns within the code word.

7. The method of claim 1 and further comprising:
(d) inverting the bit patterns of every other code word segment produced in (c) that has a predetermined running digital sum.

8. The encoder of claim 1 wherein each code word segment has the same number of bits as each data segment and each intermediate code word segment.

9. The method of claim 1 wherein each user data word has n bits, and each respective code word has n+1 bits, where n is any positive integer value.

10. The method of claim 9 wherein each user data word has 69 bits, and each respective code word has 70 bits.

11. An encoder comprising:
a user data word input for receiving a user data word;
a code word output for producing a respective code word;
a mapping block, which maps the user data word to a plurality of data segments that are constrained to a first number of bit patterns, which is less than a second number of bit patterns that satisfy a first constraint;
a first encoder, which encodes each data segment into an intermediate code word segment selected from a first set of the bit patterns that satisfy the first constraint, wherein at least some of the bit patterns in the first set violate a second constraint; and
a second encoder, which encodes the intermediate code word segments into respective code word segments by encoding the intermediate code word segments that violate the second constraint into code word segments selected from a second, different set of the bit patterns that satisfy the first constraint and the second constraint.

12. The encoder of claim 11 wherein:
the user data word is divided into a mapping segment and a plurality of passthrough segments, the number of passthrough segments equaling the number of data segments;
the mapping block maps the mapping segment into a plurality of constrained mapped segments, the number of mapped segments equaling the number of data segments; and
each mapped segment is combined with one of the passthrough segments to form one of the data segments.

13. The encoder method of claim 11 wherein the first constraint limits the bit patterns in the first and second sets to patterns having a running digital sum of −4, −2, 0, 2, 4 or 6 only.

14. The encoder method of claim 11 wherein the code word segments are combined to form the code word on the code word output.

15. The encoder of claim 14 wherein the second constraint comprises a "k" constraint that limits a distance between transitions in the bit patterns within the code word on the code word output.

16. The encoder of claim 11 and further comprising:
an inverter, which is coupled to the second encoder and inverts the bit patterns of every other code word segment produced by the second encoder that has a predetermined running digital sum.

17. The encoder of claim 11 wherein each code word segment has the same number of bits as each data segment and each intermediate code word segment.

18. The encoder of claim 11 wherein each user data word has n bits, and each respective code word has n+1 bits, where n is any positive integer value.

19. The encoder of claim 18 wherein each user data word has 69 bits, and each respective code word has 70 bits.

20. A DC-limited code in which successive m-bit unconstrained user data words are encoded into successive, corresponding n-bit code words, wherein the n-bit code words are constrained such that a running digital sum of segments of the n-bit code words is limited to a range from a positive value to a negative value, wherein the positive value has a first absolute value and the negative value has a second, different absolute value, and wherein m and n are positive integer values.

21. The DC-limited code of claim 20 wherein m=69 and n=70.

22. The DC-limited code of claim 20 wherein the running digital sum of each segment is limited to −4, −2, 0, 2, 4 or 6 only.

23. The DC-limited code of claim 22 wherein some, but not all of the segments having a predetermined running digital sum are selectively inverted.

* * * * *